(12) United States Patent
Toyoda et al.

(10) Patent No.: US 9,372,339 B2
(45) Date of Patent: Jun. 21, 2016

(54) WAVELENGTH SWEPT LIGHT SOURCE

(75) Inventors: Seiji Toyoda, Atsugi (JP); Kazunori Naganuma, Atsugi (JP); Yuichi Okabe, Atsugi (JP); Shogo Yagi, Atsugi (JP); Kazutoshi Kato, Atsugi (JP); Masahiro Ueno, Atsugi (JP); Takashi Sakamoto, Atsugi (JP); Tadayuki Imai, Atsugi (JP); Jun Miyazu, Atsugi (JP); Kazuto Noguchi, Atsugi (JP); Shigeo Ishibashi, Atsugi (JP)

(73) Assignee: Nippon Telegraph and Telephone Communications, Tokyo (JP)

( * ) Notice: Subject to any disclaimer, the term of this patent is extended or adjusted under 35 U.S.C. 154(b) by 177 days.

(21) Appl. No.: 13/978,122

(22) PCT Filed: Jan. 4, 2012

(86) PCT No.: PCT/JP2012/000017
§ 371 (c)(1),
(2), (4) Date: Jul. 3, 2013

(87) PCT Pub. No.: WO2012/093654
PCT Pub. Date: Jul. 12, 2012

(65) Prior Publication Data
US 2013/0286454 A1 Oct. 31, 2013

(30) Foreign Application Priority Data

Jan. 5, 2011 (JP) .................. 2011-000594
Jan. 21, 2011 (JP) .................. 2011-011062
Jun. 14, 2011 (JP) .................. 2011-132482

(51) Int. Cl.
*G02F 1/01* (2006.01)
*G02F 1/03* (2006.01)
(Continued)

(52) U.S. Cl.
CPC ................ *G02B 26/06* (2013.01); *H01S 3/107* (2013.01); *H01S 5/141* (2013.01); *H01S 5/143* (2013.01); *H01S 3/08027* (2013.01); *H01S 3/105* (2013.01); *H01S 5/142* (2013.01)

(58) Field of Classification Search
CPC  G01B 9/02004; G01B 9/02069; H01S 3/106; H01S 3/107; H01S 3/1109; H01S 3/1106; H01S 3/1121; H01S 5/141; H01S 5/065; H01S 3/105; H01S 3/08027; H01S 5/142; H01S 5/143; G02F 1/216; G06G 7/26; G02B 26/06
USPC ......... 372/18, 20, 98; 356/519; 359/245, 315, 359/316, 340, 344, 199.1
See application file for complete search history.

(56) References Cited

U.S. PATENT DOCUMENTS 6,205,159 B1 * 3/2001 Sesko et al. .................... 372/20
7,519,096 B2 * 4/2009 Bouma et al. ................. 372/102

(Continued)

FOREIGN PATENT DOCUMENTS

JP  2004-46524        2/2004
JP  2004046524 A  *  2/2004

(Continued)

OTHER PUBLICATIONS

Office Action in corresponding Japanese Application No. 20014-551855 dated Apr. 15, 2014.

(Continued)

*Primary Examiner* — Bumsuk Won
*Assistant Examiner* — Collin X Beatty
(74) *Attorney, Agent, or Firm* — Workman Nydegger

(57) ABSTRACT

A wavelength swept light source includes a sawtooth waveform as a main waveform and an exponential component of the sawtooth waveform to the controlled voltage of the electro-optic deflector. The controlled voltage is controlled so that, as an oscillation wavelength to be swept is swept towards a longer wavelength side, a change rate of the oscillation wavelength is increased.

16 Claims, 30 Drawing Sheets

(51) Int. Cl.
*G02F 1/07* (2006.01)
*G02B 26/06* (2006.01)
*H01S 5/14* (2006.01)
*H01S 3/107* (2006.01)
*H01S 3/08* (2006.01)
*H01S 3/105* (2006.01)

(56) References Cited

U.S. PATENT DOCUMENTS

| | | | |
|---|---|---|---|
| 7,555,226 B2* | 6/2009 | Tipper | 398/198 |
| 7,715,732 B2* | 5/2010 | Koh et al. | 398/194 |
| 8,018,598 B2* | 9/2011 | Cense et al. | 356/456 |
| 8,115,934 B2* | 2/2012 | Boppart et al. | 356/479 |
| 2003/0007526 A1* | 1/2003 | Pontis et al. | 372/38.02 |
| 2003/0107791 A1* | 6/2003 | Seung Il et al. | 359/245 |
| 2004/0010537 A1 | 1/2004 | Tejima et al. | |
| 2004/0017833 A1* | 1/2004 | Cundiff et al. | 372/18 |
| 2006/0187537 A1 | 8/2006 | Huber et al. | |
| 2008/0025349 A1 | 1/2008 | Mizutani et al. | |
| 2008/0165366 A1 | 7/2008 | Schmitt | |
| 2008/0173801 A1* | 7/2008 | Uduki | G01D 5/285 250/230 |
| 2009/0174931 A1* | 7/2009 | Huber et al. | 359/340 |
| 2009/0219378 A1 | 9/2009 | Nakamura et al. | |
| 2011/0304853 A1* | 12/2011 | Yamada et al. | 356/479 |

FOREIGN PATENT DOCUMENTS

| | | |
|---|---|---|
| JP | 2007-027306 | 2/2007 |
| JP | 2007027306 A * | 2/2007 |
| JP | 2007-234786 | 9/2007 |
| JP | 2008-209568 | 9/2008 |
| JP | 2010-515919 | 5/2010 |
| WO | 2006/137408 | 12/2006 |
| WO | 2010/047936 | 4/2010 |

OTHER PUBLICATIONS

European Search Report in corresponding European Application No. 12731920.0 dated May 8, 2014.

Andrews, John R; "Low Voltage Wavelength Tuning of an External Cavity Diode Laser Using a Nematic Liquid Crystal-Containing Birefringent Filter," IEEE Photonics Technology Letters; vol. 2, No. 5, pp. 334-336 May 1, 1990.

Oh Kee Kwon et al. "Structural Dependence of Tuning Range and Mode Stability in Grating Cavity Laser with Beam Deflector," IEEE Photonics Technology Letters; vol. 18, No. 24; Dec. 15, 2006.

International Preliminary Report on Patentability dated Jul. 18, 2013 from corresponding PCT application No. PCT/JP2012/000017.

Masamitsu Haruna, *Progress in Optical Coherence Tomography*, Applied Physics, vol. 77, No. 9, 2008, pp. 1085-1092.

Yoshiaki Yasuno, et al., *Three-dimensional and High-Speed Swept-Source Optical Coherence Tomography for in vivo Investigation of Human Anterior Eye Segments*, Optics Express, vol. 13, No. 25, 2003, pp. 10352-10664.

International Search Report dated Mar. 23, 2012 from related PCT application No. PCT/JP2012/000017.

* cited by examiner

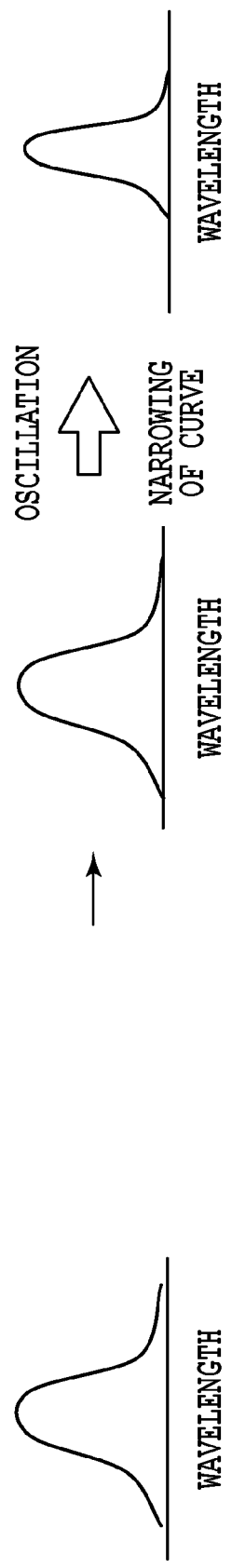
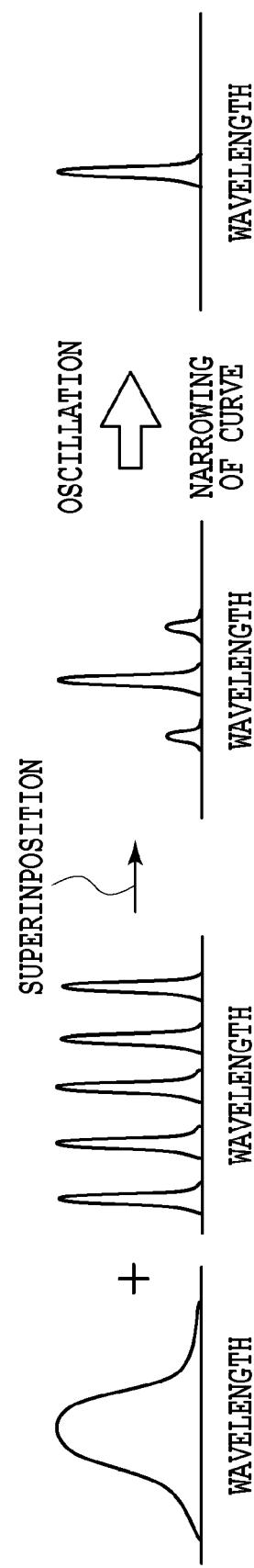
FIG.27A
FIG.27B

WAVELENGTH SWEPT LIGHT SOURCE

TECHNICAL FIELD

The present invention relates to a light source usable for an optical device, an electronic device and so forth. In more detail, the present invention relates to a wavelength swept light source usable for imaging with use of wavelength-swept light.

BACKGROUND ART

Imaging technology using an optical device has been prevailing not only in commercial electronic devices such as cameras, printers and facsimile machines but also in the medical field. X-ray photography using X-rays and diagnosis using ultrasonic waves have been widely used so far in order to non-invasively image slices in vivo. Because of exposure problems, a method using X-rays has remarkable restrictions on usage frequency and biological parts to which the method is used, and further, the resolution thereof is restricted to that of film shooting at the same magnification. A method using ultrasonic waves has no exposure problem, and therefore, has no such usage restriction as with X-rays. However, the resolution thereof is normally nothing more than roughly 1 cm. Therefore, it is impossible for the method to perform imaging at a cellular-level size.

In medical settings, a new technology has been demanded whereby images of slices under the epidermis of a living organism can be generated at a resolution of micron order. Optical coherence tomography (hereinafter referred to as OCT), since it was developed in the 1990s, has been known as a technology for implementing this.

OCT utilizes the principle of a Michelson interferometer. Low coherence light used was irradiated to a living organism. Images under the epidermis of a living organism are obtained based on interfering light produced by reference light and reflected light from the living organism. OCT has been practically used as a diagnosis device indispensable for ophthalmology in a retinal diagnosis.

FIG. 13 is a diagram explaining the basic principle of OCT (see NPL1). Only the outline of the basic principle will be hereinafter briefly described. Low coherence light with coherence length $\Delta l_c$ is supplied as incident light to a living organism 4 from a low coherence light source 1. Outgoing light 6 from the light source 1 enters a beam splitter 2 and is therein split into two halves. Light 7, which is one of the two split halves of light, travels to a movable mirror 3. The light 7 is reflected by the movable mirror 3, and travels as reference light 8 again towards the beam splitter 2. Light 9, which is the other of the two split halves of light, is reflected by any of reflection surfaces A, B and C located at different depths inside the living organism 4, and signal lights 11a, 11b and 11c are respectively obtained. Each signal light interferes with reference light 10 via the beam splitter 2. Due to the interference, such reflected light as having a wavefront distorted by excessive scattering within the living organism is removed, while such reflected light as maintaining an original plane wave is only detected selectively.

Here, when the movable mirror 3 is located in a position A', interference is only caused by the light reflected by the reflection surface A. At this time, the reference light and the signal light interfere with each other and an electric signal is obtained from a photo detector 5, when the relation of the following equation is satisfied where the distance between the center of the beam splitter 2 and the movable mirror 3 is set as LR while the distance between the center of the beam splitter 2 and the reflection surface A is set as LS.

$$|L_R - L_S| < \Delta l_c \qquad \text{equation (1)}$$

The above equation is established on a one-to-one basis respectively: between the reflection surface A and the position A' of the movable mirror; between the reflection surface B and a position B' of the movable mirror; and between the reflection surface C and a position C' of the movable mirror. Therefore, it is possible to measure a reflected light intensity distribution under the epidermis of the living organism along an optical axis (z-axis) direction within the living organism 4 with a spatial resolution $\Delta l_c$ by continuously moving the movable mirror 3 at a constant speed v. It is possible to obtain a reflected light intensity distribution under the epidermis of the living organism within an x-z plane by scanning incident light into the living organism along an x-direction by means of a scanning mirror or the like, and a final OCT image is generated based on the obtained distribution. An optical fiber coupler is usable for the configuration of the Michelson interferometer in FIG. 13, and thus, a testing device sufficiently usable even in medical settings is implemented.

In OCT configured as shown in FIG. 13, image data is obtained on a time-series basis by moving the movable mirror. Therefore, this type of OCT is referred to as time domain (TD)-OCT (hereinafter referred to as TD-OCT). In TD-OCT, it is required to move a movable mirror having a mass, and therefore, the scan speed has a limitation. However, it is often difficult to completely fix a living organism in some testing conditions, and it is preferable to obtain necessary image data by performing a scan in a short time as much as possible. Incidentally, when a scan is performed for a part in vivo that is located at a depth where blood vessels exist, it becomes difficult to obtain images because of scattering by red blood cells moving within the blood vessels. Therefore, it has been demanded in OCT to obtain information in the depth direction as quick as possible.

In view of the above, Fourier domain (FD)-OCT (hereinafter referred to as FD-OCT) was proposed for obtaining reflected light intensity along an optical axis by Fourier-transforming an interfering signal. In FD-OCT, a spectrometer, decomposing a signal light from a living organism into lights with respective wavelengths, is disposed forwards of the photo detector 5 in FIG. 13, and a detector factor array of the photo detector detects an interfering spectrum. In other words, the interfering spectrum is obtained by a parallel detector in which a large number of detector factor elements relevant to the respective wavelengths are disposed. A reflected light intensity distribution along an optical axis is obtained by Fourier-transforming the spectrum detected by the parallel detector. However, it is required in FD-OCT to provide the parallel detector having a large number of detector factor elements. When a large number of detector factor elements are provided, it is required to simultaneously detect signals with respective wavelengths in more than 1000 detector factor elements. Such parallel detector has been implemented at a wavelength band of 1.1 µm or less in the form of a silicon CCD or a CMOS, but it is difficult to obtain a parallel detector implemented at a longer wavelength.

Therefore, at this point of time, FD-OCT is applicable to a retinal diagnosis for which visible light is usable, but is not applicable to OCT for tissues (e.g., skin) requiring an operation at a longer wavelength range. Further, in application to slice imaging of a blood vessel, absorption by hemoglobin of red blood cells cannot be ignored unless light with a longer wavelength of roughly up to 1.3 µm is used because of scattering by hemoglobin. On the other hand, absorption by water becomes remarkable, in turn, when the wavelength of a light source gets closer to 1.5 μm. It becomes difficult to obtain a photo detector when the wavelength exceeds 1.6 μm. Due to these reasons, it has been demanded to use a light source at 1.3 μm band in order to utilize OCT for skin and so forth.

In view of this, a method having received attention anew is swept source (SS)-OCT (hereinafter referred to as SS-OCT) for sweeping the frequency of a light source by changing FD-OCT. In SS-OCT, a light source wavelength is regularly swept unlike FD-OCT in which a large number of wavelength signals are generated at one time by causing a spectrometer to decompose signal light obtained by irradiating a living organism with light from a coherence light source. Through the sweep of the frequency of light from the light source, signals with respective wavelengths can be detected on a time-division manner using a single detector. In other words, in FD-OCT, wavelength division is performed based on a spatial position by a spectrometer, whereas in SS-OCT, wavelength division is performed based on time and therefore only a single detector is required. A parallel detector having a large number of detector factor elements is not required, and there is no limitation on selection of a detector. Therefore, even a light source at a 1.3 μm band can be used.

FIG. 14 is a diagram schematically shown for explaining the principle of SS-OCT (NPL1). In SS-OCT, an optical signal 26 that the optical frequency thereof is linearly swept with respect to time is supplied to a living organism 24 from an optical frequency (wavelength) swept light source 21. For example, a wavelength variable laser is used as the optical frequency swept light source 21. In SS-OCT shown in FIG. 14, the position of a mirror 23 is stationary. Respective elements are disposed for establishing $L_R = L_S$, where the distance between the center of a beam splitter 22 and the mirror 23 is set as LR while the distance between the center of the beam splitter 22 and a living organism surface 31 is set as LS.

At this time, regardless of time, differences in optical frequencies are constant between reference light 28 and reflected lights 29b and 29c respectively from reflection surfaces 32 and 33 in vivo. Where these differences in optical frequencies are set as $f_2$ and $f_3$, signal light, in which beat frequencies $f_2$ and $f_3$ relevant to the reflection surfaces 32 and 33 coexist, is obtained by the interference between the reference light 28 and the reflected lights 29b and 29c. When the signal light is Fourier-transformed, reflected light intensities at the beat frequencies $f_2$ and $f_3$ are obtained. When the optical frequency from the light source 21 is linearly swept, the beat frequencies $f_2$ and $f_3$ are directly proportional to depths $d_2$ and $d_3$, respectively. Reflected lights are produced at respective positions in vivo, and therefore, it is possible to obtain a distribution of reflected light intensity along the optical axis (z-axis) direction by Fourier-transforming the interfering light. When a beam scan is also performed in the x-axis direction, an OCT image within an x-z plane is obtained.

Unlike the well-known FD-OCT, no parallel detector is required for SS-OCT because only a photo detector 25 is required to detect signal light in which interfering lights at different beat frequencies coexist by means of a single detection element. It becomes possible to use a swept light source at a 1.3 μm band that is preferred to a diagnosis of skin and so forth. Practical use of SS-OCT has been progressed even in the fields other than ophthalmic care due to: its stable configuration using a photo fiber coupler; its high-speed image obtainment attributed to inessential of a movable mirror; and its easiness in utilizing various photo detectors.

CITATION LIST

Patent Literature

PTL1: Specification of International Patent Publication No. WO2006/137408

Non Patent Literature

NPL1: Masamitsu Haruna, "Progress in Optical Coherence Tomography", Applied Physics Vol. 77, No. 9, p 1085-1092, 2008

SUMMARY OF INVENTION

Technical Problem

In the aforementioned SS-OCT, a sweep, i.e., an optical wavelength swept light source is one of the important components. For example, an optical wavelength swept light source using a polygon mirror has been used as an optical wavelength swept light source of a well-known art.

FIG. 15 is a diagram showing a configuration of a wavelength swept light source using a polygon mirror in the well-known art. The wavelength swept light source 100 is configured by including a polygon mirror 120 and a laser oscillator composed of a diffraction grating 106, a gain medium 101 and so forth that are disposed in a Littrow configuration. The laser oscillator includes collective lenses 102 and 111 on the both ends of the gain medium 101, and output light 113 is obtained from an output coupling mirror 122. The incident light from the gain medium 101 is reflected by the reflection surface A of the polygon mirror 120, and enters the diffraction grating 106 at an incident angle θ (110) satisfying a condition of the following diffraction grating equation.

$$2\Lambda \sin \theta = m\lambda \qquad \text{equation (2)}$$

In the above equation, Λ is set as a pitch of a diffraction grating; λ is set as an oscillation wavelength; and m is set as a diffraction order.

Oscillation light is reflected by the diffraction grating 106 at an outgoing angle θ equal to the incident angle and reciprocates along an optical path between the diffraction grating 106 and the output coupling mirror 122. The polygon mirror 120 is rotated in a direction 121 at a constant speed, and therefore, the incident-reflection angle of the oscillation light on the reflection surface A of the polygon mirror 120 periodically varies in accordance with the rotation. Therefore, the oscillation wavelength λ, determined by the equation (2), varies with the rotation by the incident angle θ into the diffraction grating 106. The polygon mirror 120 is rotated at a constant rotation speed, and therefore, the incident (reflection) angle θ into the diffraction grating 106 varies at a constant speed. Therefore, the oscillation wavelength λ of the wavelength swept light source 100 roughly linearly varies with time.

FIG. 16 is a chart showing time variation in oscillation wavelength obtained by the wavelength swept light source using a polygon mirror in the well-known art. As depicted with a solid line 40, the oscillation wavelength varies roughly linearly (straightly) in an upwardly slight convex shape as a function of time, t. However, a wavelength time variation profile obtained for SS-OCT is different from such time variation that the oscillation wavelength linearly varies, i.e., such time variation that is obtained by the wavelength swept light source using a polygon mirror.

The basic principle of OCT explained with FIG. 13 will now be referred again. In OCT, the delay times of the reference lights 7 and 8 are required to linearly vary in order to linearly scan in vivo with a good linearity in the optical axis (z-axis) direction. In other words, when the position of the movable mirror 3 is moved at a constant speed from A' to C' over the entire movable range, a scan in vivo is also performed at a constant speed. Such operation is the most ideal in terms of linearity of an OCT image. When the mirror is not moved at a constant speed, a resultant OCT image will be non-linearly distorted in the optical axis (z-axis) direction.

Further, a case is herein assumed that the aforementioned ideal operation of the movable mirror moving at a constant speed is applied to the configuration of SS-OCT in FIG. 14. When the mirror position is Fourier-transformed, the inverse of the position is obtained. In other words, the inverse of the position corresponds to a wavenumber. Therefore, such a wavelength swept light source is ideal that wavelength varies so that the wavenumber (inverse of wavelength) linearly varies with time. Otherwise, a single beat frequency can no longer correspond to a single reflection surface in vivo. As a result, sharpness of an OCT image is deteriorated.

In FIG. 16, wavelength variation where the wavenumber linearly varies with time is simultaneously depicted as desirable wavelength variation with a dashed line 41. Such a wavelength variation profile is appropriate that wavelength variation is curved in a downwardly convex shape and the change rate is increased as an oscillation wavelength shifts to the loner wavelength side (upper side of the vertical axis of FIG. 16), when visually compared with wave height variation in the wavelength swept light source using a polygon mirror in the well-known art.

However, when a polygon mirror is used, it is quite difficult to control the rotational speed of the polygon mirror with a manner other than a constant rotation speed, because the polygon mirror has a large moment of inertia. Further, upwardly convex and roughly linear wavelength variation, which is shown in FIG. 16 as wavelength variation in the well-known art using a polygon mirror, has a shape attributed to a sine term of the diffraction grating equation of equation (2), and the curving direction cannot be changed even if normal means is used.

As described above, the wavelength swept light source of the well-known art has had a drawback that wavelength variation suitable for SS-OCT could not be implemented and a sharp OCT image could not be obtained.

Solution to Problem

The present invention has been produced in view of the drawback as described above, and it is an object of the present invention to provide a wavelength swept light source applicable to SS-OCT whereby a sharp OCT image can be obtained by excluding linear distortion from an OCT image in the depth direction.

An invention according to claim 1 is a wavelength swept light source that an output wavelength temporally and periodically varies, and is characterized in comprising: an oscillator part including an electro-optic deflector; and a controlled voltage generator part configured to generate a controlled voltage that is configured to be applied to the electro-optic deflector, and that not only a sawtooth waveform as a main waveform but also an exponential component of the sawtooth waveform is superimposed.

As the electro-optic deflector, it is preferable to use potassium tantalate niobate ($KTa_{1-x}Nb_xO_3$ ($0<x<1$): KTN) or ($K_{1-y}Li_yTa_{1-x}Nb_xO_3$ ($0<x<1$, $0<y<1$)) obtained by further doping lithium thereto.

An invention according to claim 2 relates to the wavelength swept light source according to claim 1, and is characterized in that: the oscillator part is configured by including a resonator that includes a gain medium and a diffraction grating that a light enters from an end of the gain medium, while the gain medium and the diffraction grating are optically connected; the electro-optic deflector is disposed on an optical path formed by the resonator while being disposed between the gain medium and the diffraction grating; and where a light incident angle into the diffraction grating from the electro-optic deflector is set as $\theta$ and a controlled-voltage-to-angle sensitivity of the electro-optic deflector is set as $\gamma$ [rad/V], as the exponential component of the sawtooth waveform, $$\gamma \frac{3 + \cos 2\theta}{2\sin 2\theta} \qquad \text{Math 1}$$

a squared component having a coefficient expressed with the above equation is superimposed.

The controlled voltage generator part can be configured by an analog electronic circuit and can be configured by the combination of sawtooth waveform generation, a multiplier and an accumulator. When an electro-optic deflector such as a KTN is used, a high voltage amplifier is preferably included therein for generating a controlled voltage. At this time, the controlled-voltage-to-angle sensitivity $\gamma$ [rad/V] is assumed to include a gain A of the high voltage amplifier. An arbitrary waveform generator is also available as the controlled voltage generator part.

An invention according to claim 3 relates to the wavelength swept light source according to claim 2, and is characterized in that as the exponential component of the sawtooth waveform, in addition to the squared component, $$\gamma^2 \frac{17 + 6\cos 2\theta + \cos 4\theta}{6\sin^2 2\theta} \qquad \text{Math 2}$$

a cubed component having a coefficient expressed with the above equation is further superimposed.

An invention according to claim 4 relates to the wavelength swept light source according to claim 1, and is characterized in that: the oscillator part is configured by including a resonator that includes a gain medium, a diffraction grating that a light enters from an end of the gain medium, and an end surface mirror that a diffracted light of the incident light into the diffraction grating enters at a normal incidence, while the gain medium and the end surface mirror are optically connected through the diffraction grating; the electro-optic deflector is disposed on an optical path formed by the resonator while being disposed between the gain medium and the diffraction grating; and where a light incident angle into the diffraction grating from the electro-optic deflector is set as $\theta$, a light incident angle into the diffraction grating from the end surface mirror is set as $\phi$, and a controlled-voltage-to-angle sensitivity of the electro-optic deflector is set as $\gamma$ [rad/V], as the exponential component of the sawtooth waveform, $$\gamma \frac{3 + \cos2\theta + 2\sin\phi\sin\theta}{2(\sin2\theta + 2\sin\phi\cos\theta)} \quad \text{Math 3}$$

a squared component having a coefficient expressed with the above equation is superimposed An invention according to claim 5 relates to the wavelength swept light source according to claim 4, and is characterized in that as the exponential component of the sawtooth waveform, in addition to the squared component, $$\gamma^2 \frac{\begin{array}{c}21 - 4\cos2\phi + 26\sin\phi\sin\theta + \\ 2(2 + \cos2\phi)\cos2\theta + 2\sin\phi\sin3\theta + \cos4\theta\end{array}}{6(\sin2\theta + 2\sin\phi\cos\theta)^2} \quad \text{Math 4}$$

a cubed component having a coefficient expressed with the above equation is further superimposed.

Advantageous Effects of Invention

As explained above, the present invention can provide a wavelength swept light source for implementing wavelength variation suitable for SS-OCT. Wavelength variation on a time axis implements a wavelength sweep with a profile that the wavenumber linearly varies, and therefore, linearity of an OCT image can be remarkably improved and a sharp OCT image can be obtained.

As explained above, the present invention can provide a wavelength swept light source for implementing wavelength variation suitable for SS-OCT. Wavelength variation on a time axis implements a wavelength sweep with a profile that the wavenumber linearly varies, and therefore, linearity of an OCT image can be remarkably improved and a sharp OCT image can be obtained.

BRIEF DESCRIPTION OF DRAWINGS

FIG. 27A is a chart showing a condition of a wavelength where no etalon filter is used;

FIG. 27B is a chart showing a condition of a wavelength where the etalon filter is used;

DESCRIPTION OF EMBODIMENTS

The present invention is characterized in causing a wavelength swept light source using an electro-optic deflector including KTN and so forth to appropriately shape the waveform of controlled voltage to be applied to the electro-optic deflector in order to produce such wavelength variation that the wavenumber linearly varies with time. Firstly, detailed explanation will be hereinafter made for a configuration of the wavelength swept light source according to an embodiment. Next, explanation will be made for a configuration and an operation of the electro-optic deflector. Finally, explanation will be made for a method of controlling the controlled voltage peculiar to the embodiment of the present invention, which results in such wavelength variation that the wavenumber linearly varies with time.

First Embodiment

Figure 1:
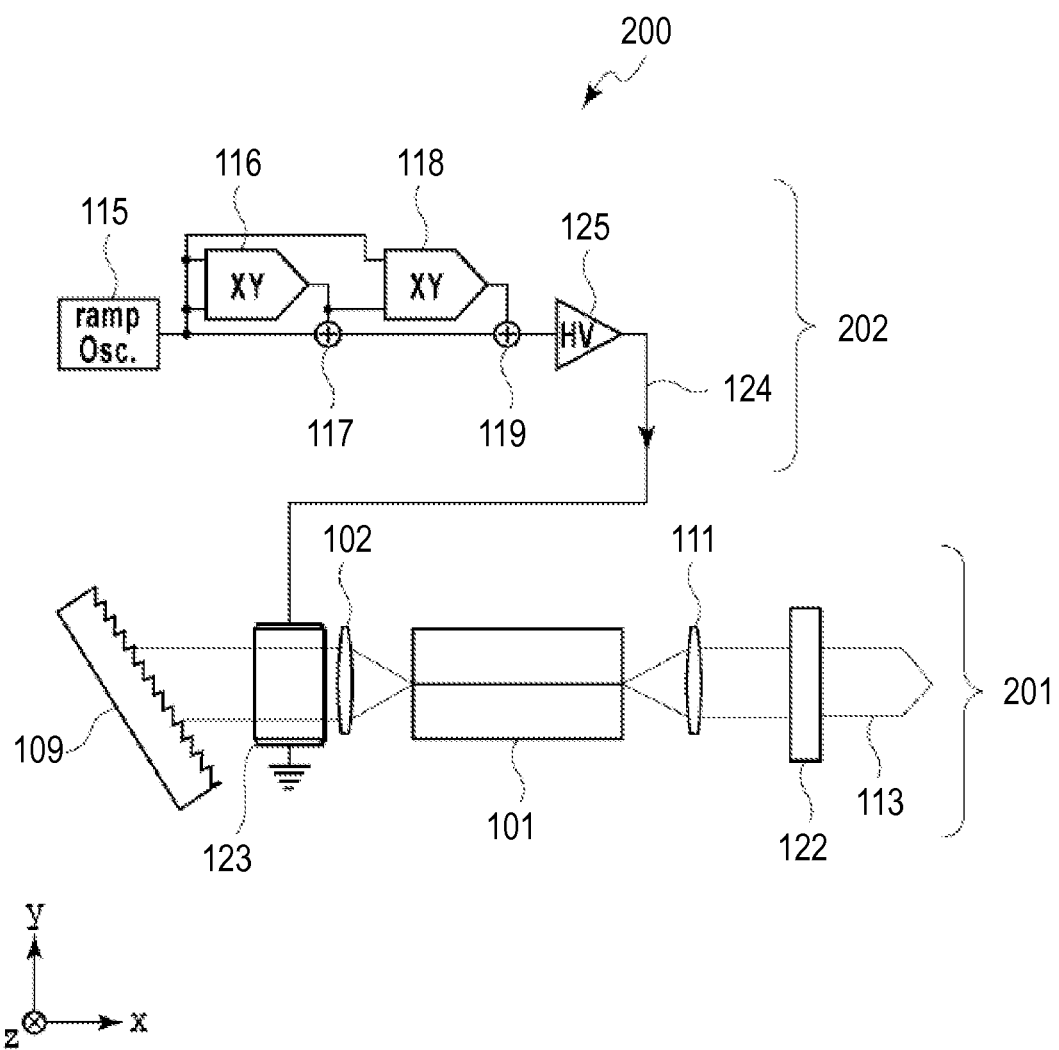
FIG. 1 is a diagram showing a first configuration of a wavelength swept light source of the present invention.

FIG. 1 is a diagram showing a first configuration of a wavelength swept light source according to the present invention. A wavelength swept light source 200 is composed of an oscillator part 201 and a controlled voltage generator part 202. The oscillator part 201 is a laser oscillator with a Littrow configuration, and a gain medium 101 is disposed between a first collective lens 111 and a second collective lens 102. A diffraction grating 109 is disposed in such a position to produce a Littrow arrangement that incident light and diffracted light are inputted into and outputted from the gain medium 101 in the same direction. The gain medium 101 and the diffraction grating 109 are optically connected, and thereby, an optical resonator is configured. An electro-optic deflector 123 is disposed on an optical path that is located between the collective lens 102 and the diffraction grating 109 and is formed by the resonator. The first collective lens 111 is opposed to an output coupling mirror 122, and thus, an optical resonator is configured by including the output coupling mirror 122 and the diffraction grating 109 as the both ends thereof. Output light 113 is obtained from the output coupling mirror 122 by means of the laser action of the optical resonator.

An oscillation wavelength is swept by deflecting incident light flux into the diffraction grating 109 by means of controlled voltage 124 which controls the electro-optic deflector 123 from the controlled voltage generator part 202. In other words, an incident angle into the diffraction grating 109 is changed by the deflection of the electro-optic deflector 123. In the configuration of the present invention, a wavelength can be swept at a high speed without the intervention of a movable part by changing voltage to be applied to the electro-optic deflector 123. Detailed explanation will be made below for a specific configuration of the electro-optic deflector.

The controlled voltage generator part 202 generates the controlled voltage 124 that is applied to the electro-optic deflector and is peculiar to the present invention. In the controlled voltage generator part 202, the sawtooth waveform output from a sawtooth waveform generator 115 is connected to two inputs of a first multiplier 116. The output of the first multiplier 116 is inputted into one input of a second multiplier 118 and a first accumulator 117. The sawtooth waveform output from the sawtooth waveform generator 115 is also connected to the other input of the second multiplier 118. The output of the second multiplier 118 is inputted into a second accumulator 119. The sawtooth waveform generator 115, the first accumulator 117 and the second accumulator 119 are cascade-connected.

As is obvious from the configuration of the controlled voltage generator part 202 shown in FIG. 1, a squared component of a sawtooth waveform is obtained in the output of the first accumulator 117, whereas a cubed component of a sawtooth waveform is obtained in the output of the second accumulator 119. The output of the second accumulator 119 is inputted into a high voltage amplifier 125 having a voltage gain A and is therein amplified to a required voltage level; thereby, the controlled voltage 124 is obtained. As described below, it is desirable to utilize an electro-optic crystal such as potassium tantalate niobate (KTN) for the electro-optic deflector 123, and therefore, a voltage level of about several hundred voltage is required. Although not explicitly shown in FIG. 1, gains can be respectively set in the first multiplier 116 and the second multiplier 118 and also can be turned off.

By appropriately setting the gain of the first multiplier 116 and that of the second multiplier 118, it is possible in the output of the second accumulator 119 to obtain such waveform that, with respect to a sawtooth waveform as a main waveform, a squared component of the sawtooth waveform and a cubed component of the sawtooth waveform are respectively superimposed with desired coefficients.

Figure 16:
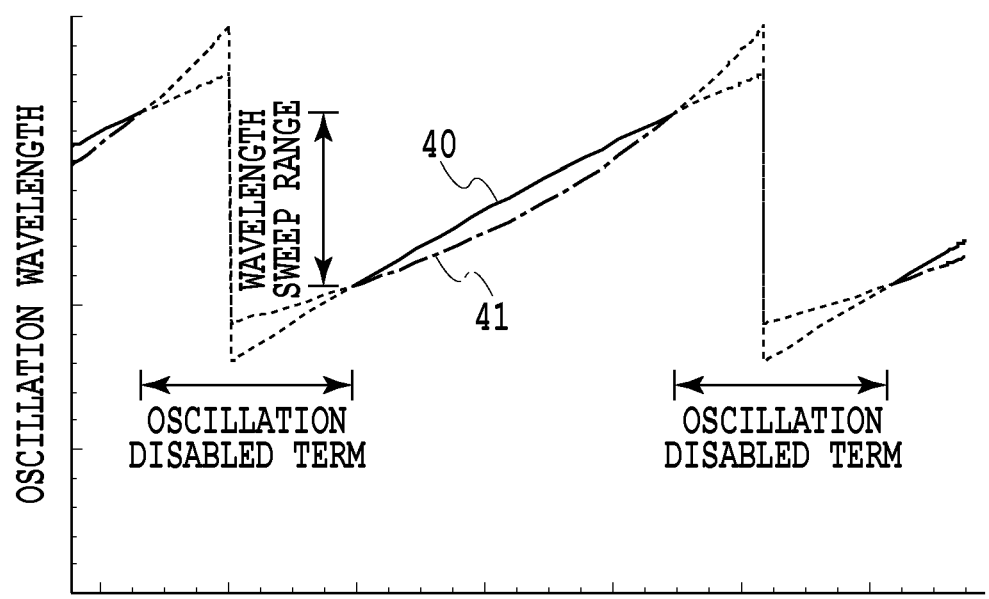
FIG. 16 is a chart showing time variation in oscillation wavelength to be obtained by the wavelength swept light source suing the polygon mirror of the well-known art.

As explained in the technical problem of the present invention, in a wavelength variable light source that has been utilized for SS-OCT in the well-known art, the oscillation wavelength roughly linearly (straightly) varies in an upwardly slight convex shape as a function of time, t as shown in FIG. 16. This corresponds to a case that the oscillator part 201 is controlled where the gain of the first multiplier 116 and that of the second multiplier 118 are set to be 0 in the controlled voltage generator part 202 of FIG. 1. In other words, this corresponds to a state that only a sawtooth waveform is applied as the controlled voltage 124 to the electro-optic deflector 123. As described below, in the present invention, through the correction of the controlled voltage, the electro-optic deflector 123 is controlled not only with a sawtooth waveform but also with a waveform on which a squared component of the sawtooth waveform and a cubed component of the sawtooth waveform are superimposed. Detailed explanation of correcting the controlled voltage will be described below.

Second Embodiment

Figure 2:
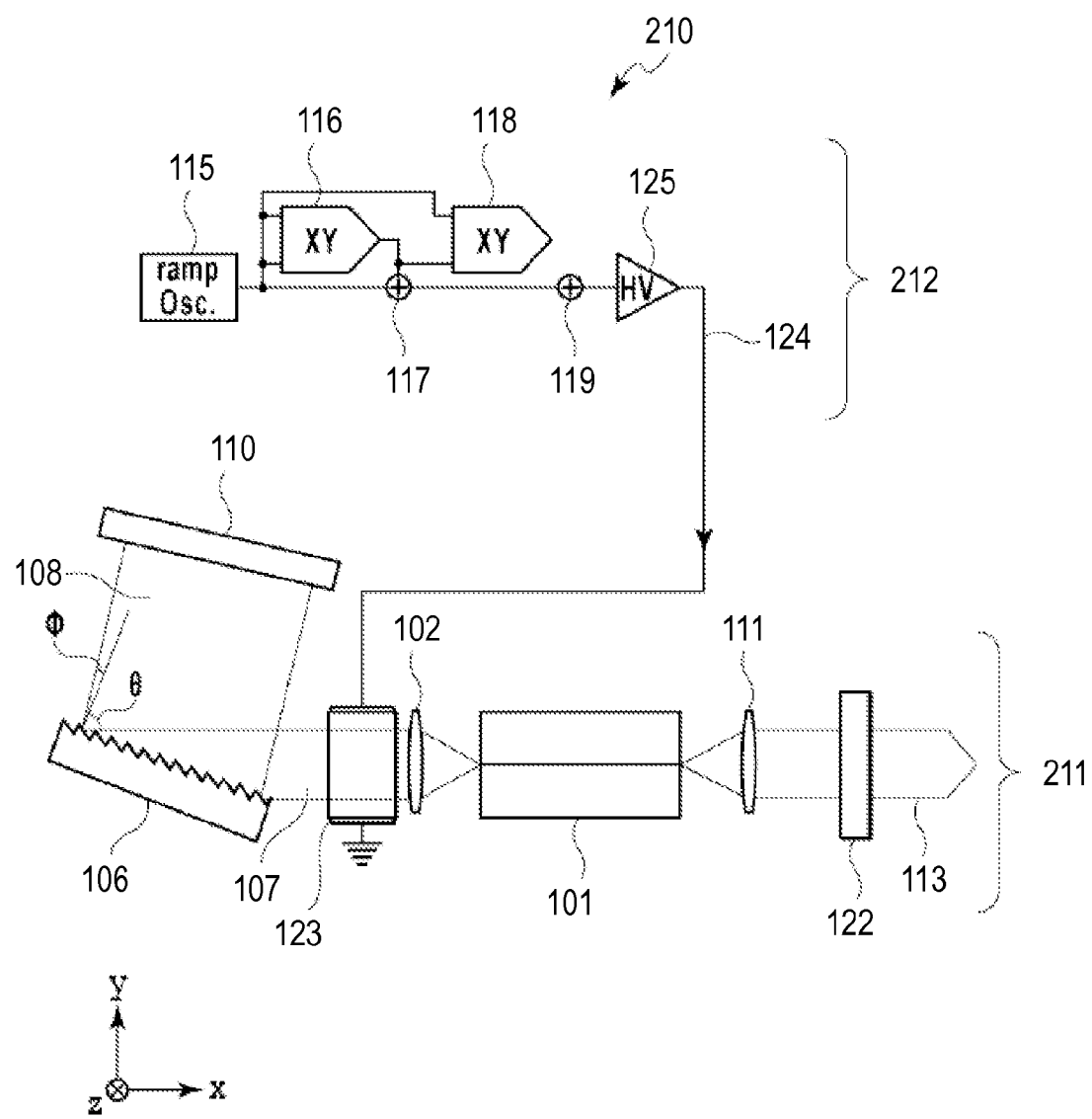
FIG. 2 is a diagram showing a second configuration of the wavelength swept light source of the present invention.

FIG. 2 is a diagram showing a second configuration of the wavelength swept light source of the present invention. A wavelength swept light source 210 is composed of an oscillator part 211 and a controlled voltage generator part 212. The oscillator part 211 is a laser oscillator with a Littman configuration, and is different from the oscillator part 201 with a Littrow configuration in the first configuration. However, the controlled voltage generator part 212 is the same as the controlled voltage generator part 202 in the first configuration. Therefore, only the configuration of the oscillator part 211 will be explained next.

In FIG. 2, the gain medium 101 is disposed between the first collective lens 111 and the second collective lens 102. The gain medium 101 is connected, through the second collective lens 102, to a wavelength filter composed of the electro-optic deflector 123, a diffraction grating 106 and a normal-incident end surface mirror 110. Further, the gain medium 101 and the end surface mirror 110 are optically connected through the diffraction grating 106, and thereby, a resonator is configured. Moreover, the first collective lens 111 is opposed to the output coupling mirror 122, and as a whole, an optical resonator is configured by including the output coupling mirror 122 and the end surface mirror 110 as the both ends thereof. The output light 113 is obtained from the output coupling mirror 122 by means of the laser action of the optical resonator. The electro-optic deflector 123 is disposed on an optical path that is located between the gain medium 101 and the diffraction grating 106 and is formed by the resonator.

In the wavelength swept light source of the present invention, no particular restriction is imposed on a relation between an incident angle θ into the diffraction grating 106 from the side faced to the collective lens 102 and an incident angle φ into the diffraction grating 106 from the side faced to the end surface mirror 110. However, to obtain a stronger filter effect, it is preferable in the aforementioned wavelength filter to set the incident angle θ into the diffraction grating 106 from the side faced to the collective lens 102 to have an absolute value greater than that of the incident angle φ into the diffraction grating 106 from the side faced to the end surface mirror 110. As a result, diffraction grating outgoing light flux 108 is expanded in comparison with diffraction grating incident light flux 107 into the diffraction grating 106, and is reflected by the end surface mirror 110 as a thick light flux with a small divergence angle. Therefore, the selective wavelength width of the wavelength filter can be narrowed. The oscillation wavelength is swept by deflecting the diffraction grating incident light flux 107 through the controlled voltage source 124 connected to the electro-optic deflector 123.

In other words, the incident angle θ into the diffraction grating 106 is changed by the deflection of the electro-optic deflector 123. In the wavelength swept light source of the present invention, the wavelength can be swept at a high speed without the intervention of a movable part by changing the voltage 124 to be applied to the electro-optic deflector 123. Next, explanation will be made for the electro-optic deflector preferred to be used for the wavelength variable light source of the present invention.

Recently, a new phenomenon has been found in a specific electro-optic effect crystal. In the electro-optic effect crystal, charges are injected into the crystal in accordance with generating of an electric field by voltage application. As a result, either a special charge distribution formed by injected charges into the electro-optic crystal or a trapped charge distribution formed by the injected charges further trapped into the electro-optic crystal is produced within the crystal. Then, a non-uniform electric field distribution attributed to the charge distribution evokes the gradient of a refractive index, and there occurs a phenomenon of bending a light ray path perpendicular to the gradient.

To cause the phenomenon, either variation in a refractive index or a quadratic electro-optic effect caused in proportion to square of an electric field is required. Further, this deflection phenomenon is caused with applied voltage and current having realistic values only when the crystal exhibiting the effect has a large permittivity and a small mobility. Potassium tantalate niobate ($KTa_{1-x}Nb_xO_3$ (0<x<1): KTN) and ($K_{1-y}Li_yTa_{1-x}Nb_xO_3$ (0<x<1, 0<y<1)) obtained by further doping lithium thereto are known as representative examples of this type of crystal.

In such crystal, all the parts within the crystal are in charge of the deflection action. A light ray is exited from the crystal under the deflection by the accumulation of actions in the respective parts on a light ray propagation path. In other words, a resultant deflection angle is proportional to a light propagation length within the crystal. In this regard, the deflector has an operation mechanism completely different from that of a prism-type optical deflector that has been used so far. As a result of its peculiar deflection mechanism, the deflector is characterized in that a deflection operation is performed at a high speed and in that a large deflection angle range is obtained. PTL1 describes such an electro-optic deflector in detail.

Figure 3:
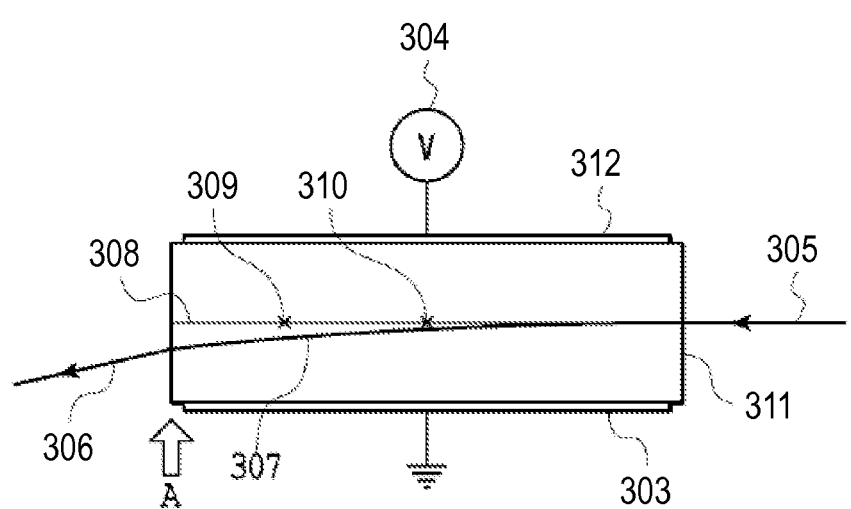
FIG. 3 is a diagram explaining a configuration and an operation of a deflector to be used for the wavelength swept light source of the present invention.

FIG. 3 is a diagram explaining a configuration and an operation of the deflector to be used for the wavelength swept light source of the present invention. FIG. 3 explains a basic configuration and an operation when the inside of the deflection surface of the deflector is viewed. An electrode 312 and a ground electrode 303 are respectively formed on the opposed surfaces of an electro-optic crystal 311. Incident light 305 is propagated along a center optical axis 308 passing through the middle of these two electrodes. When voltage is herein applied to the electrode 312 by a controlled voltage source 304, a light ray within the crystal tracks a deflection optical path 307 bent towards a negative electrode (the ground electrode 303 in FIG. 3 showing a state of positive voltage application), and is then exited from the crystal 311 as deflected outgoing light 306.

When the polarization optical path 307 is observed on "the crystal side (inside)" of an outgoing end surface A, a light ray appears to be exited from a polarization center 310 located in the crystal center. In other words, a light ray appears to be rotated about the polarization center 310 due to the deflection action. In turn, when this is observed regarding the outgoing light 306 on "the outside" of the crystal, a light ray appears to be rotated about an outgoing center 309 due to the deflection action. Such outgoing center 309 gets closer to the outgoing end surface by the refractive action at the outgoing end surface A, and is located in a position away from the outgoing end surface A at a distance of L/(2n) where the crystal length is set to be L. Here, n is the refractive index of the crystal.

The aforementioned deflection angle obtained in the electro-optic deflector is proportional to the crystal length. However, in attempting to elongate the crystal, it becomes more difficult to reliably achieve uniformity for the crystal. Further, when the crystal is elongated, capacitance is increased and thereby apparent power required for the controlled voltage source 304 is increased. As a result, the high speed driving of the electro-optic deflector is difficult. In this type of electro-optic deflector, it is also possible to achieve an effect equivalent to that achieved when the crystal length is increased by utilizing folding-back of an optical path caused by internal reflection instead of using a crystal with an actually required length.

Next, regarding an operation of the wavelength swept light source of the present invention, detailed explanation will be made for the controlled voltage 124 to be applied to the electro-optic deflector 123 from the controlled voltage generator part 202, 212. Here, δ is set as the change angle of the incident angle into the diffraction grating to be received by the electro-optic deflector.

In general, in an electro-optic deflector utilizing KTN or the like, the controlled voltage becomes positive voltage when the optical path within the electro-optic deflector is deflected to the downward of the y-axis of FIG. 1 or 2 and δ becomes negative. For easy explanation, the controlled voltage 124 and δ are assumed to have a roughly linear relation. In other words, the controlled voltage 124 and δ are assumed to be in a directly proportional relation.

In the configuration shown in FIG. 1 or 2, by applying to KTN such controlled voltage 124 that the change rate of δ is increased as the value of δ becomes increasingly positive, it is possible to obtain such wavelength swept profile that time variation in oscillation wavelength has a downwardly convex shape. In other words, the controlled voltage may be controlled so that the change rate of the oscillation wavelength is increased as the oscillation wavelength is swept to the longer wavelength side. When the controlled voltage is thus corrected, the oscillation wavelength varies more quickly as the oscillation wavelength is shifted to the longer wavelength side, and time variation in oscillation wavelength is formed in a downwardly convex shape. At this time, in the wavelength swept light source of the present invention, the swept wavelength is controlled so that the wavenumber linearly varies on the time axis. Therefore, when the present invention is applied to SS-OCT, it is possible to obtain a sharp OCT image with good linearity in the depth direction of a living organism as an object.

In the present invention, a control signal, applied as the controlled voltage to the electro-optic deflector, is not a control signal with a sawtooth waveform that has been used in the well-known art but a control signal that in addition to a sawtooth waveform as a main waveform, an exponential component of the sawtooth waveform is superimposed with a predetermined coefficient (amplitude ratio). With this, a controlled voltage profile of a wavelength swept light source, preferred in application to SS-OCT, is implemented. As a result of performing correction by superimposing an exponential component of a sawtooth waveform with a predetermined coefficient (amplitude ratio), time variation in oscillation wavelength is formed in a downwardly convex shape. At this time, in the wavelength swept light source of the present invention, time variation in wavelength is controlled so that it can linearly vary with respect to the wavenumber.

Figure 4A:
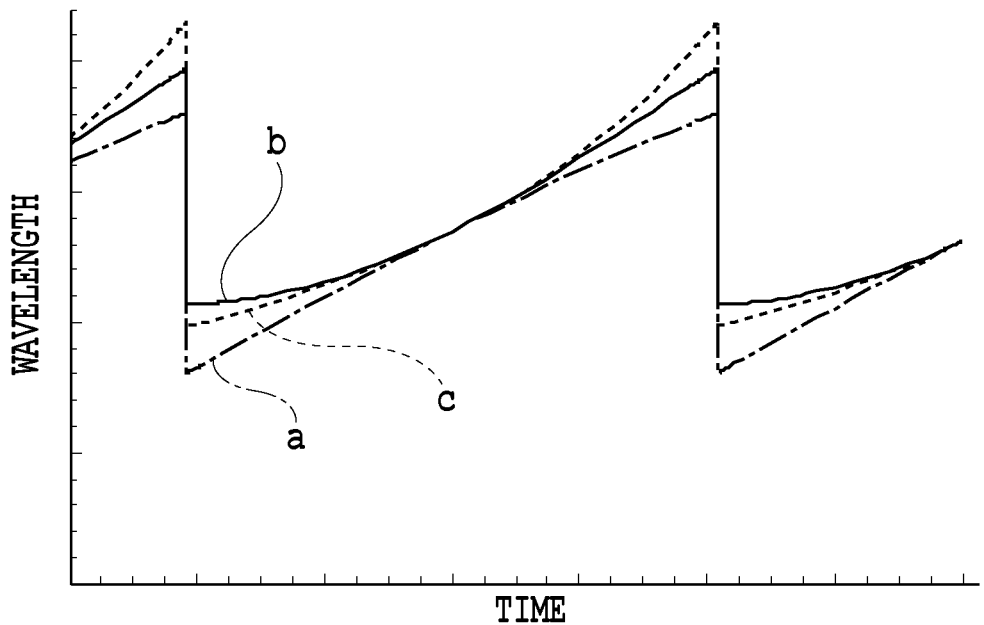
FIG. 4A is a chart showing a first example of time variation in wavelength to be used for the wavelength swept light source having the first configuration of the present invention.
Figure 4B:
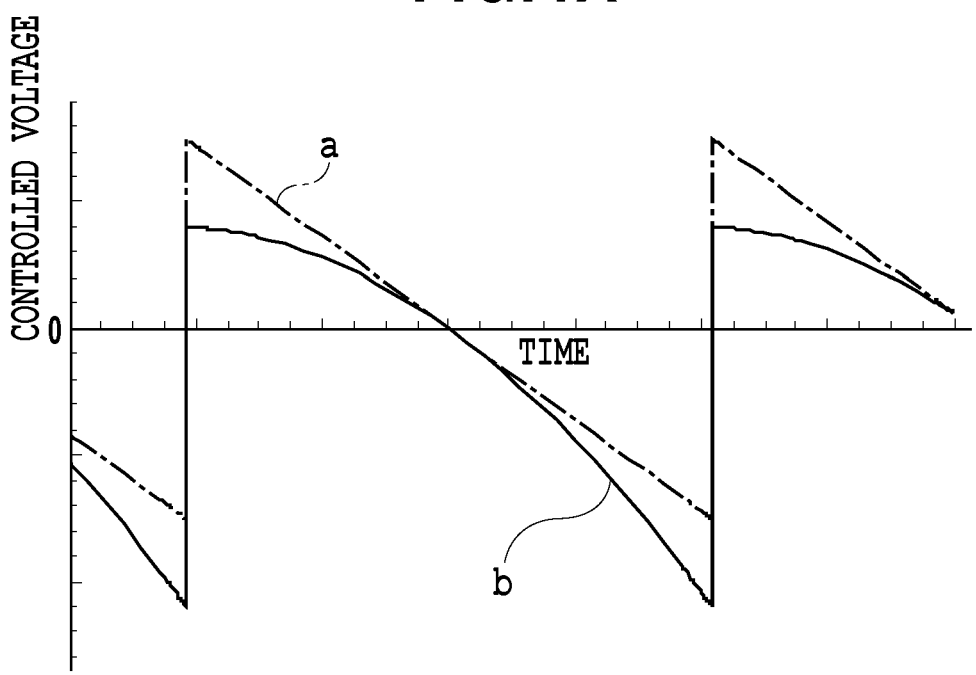
FIG. 4B is a chart showing a first example of time variation in controlled voltage to be used for the wavelength swept light source having the first configuration of the present invention.

FIG. 4A is a chart showing a first example of time variation in wavelength to be used for the wavelength swept light source having the first configuration of the present invention, whereas FIG. 4B is a chart showing a first example of time variation in controlled voltage to be used for the wavelength light source having the first configuration of the present invention. FIGS. 4A and 4B show a controlled voltage waveform where with respect to a sawtooth waveform as a main waveform, only a squared component of the sawtooth waveform is superimposed. FIG. 4A shows time variation in wavelength, whereas FIG. 4B shows time variation in controlled voltage to be applied by the controlled voltage generator part. The waveform of a dashed line a shows a case (ramp waveform) that only the sawtooth waveform of the well-known art is applied. The waveform of a solid line b shows a case that only the squared component of the present example is superimposed. The waveform of a dotted line c shows desirable waveform variation.

In the present example, the squared component is superimposed with the following amplitude ratio. In FIG. 1, the light incident angle into the diffraction grating 109 from the electro-optic deflector 123 is set as $\theta$. The voltage gain of the high voltage amplifier 125 is set as A. Therefore, a product, obtained by multiplying a controlled-voltage-to-deflection-angle sensitivity of the electro-optic deflector 123 as a single component by A, is set as $\gamma$ (rad/V). Here, $\gamma$ corresponds to a value obtained by dividing the deflection angle by the voltage to be applied to the deflector. Where controlled voltage is set as $V(t) = V_0 \times t + V_1 \times t^2 + V_2 \times t^3$, a method of determining the coefficient of the squared component and that of the cubed component will be hereinafter explained. Here, $V_0$ represents a linear coefficient of time; $t$ represents time; $V_1$ represents a quadratic coefficient of time; and $V_2$ represents a cubic coefficient of time. A controlled voltage waveform b in FIG. 4B is set so that the coefficient of the squared component of a sawtooth waveform can be expressed with the following equation by regulating the gain of the first multiplier 116.

equation (4)

$$\gamma \frac{3 + \cos 2\theta}{2 \sin 2\theta} \quad \text{Math. 5}$$

The above equation is derived by expressing the equation (2) as $2\Lambda \sin(\theta + \delta) = m\lambda$ where $\delta$ is overtly included in the equation (2) and by obtaining a condition that second-order derivative of t at a wavenumber of $1/\lambda$ becomes zero around a zero of a function $\delta(t)$ of time t.

It is understood that time variation in wavelength depicted with the solid line b is formed in a downwardly convex shape by superimposing the squared component with a predetermined amplitude ratio and rather approximates to desired variation in wavelength depicted with the dotted line c. However, further improvement is demanded because the change rate is excessive on the shorter wavelength side whereas the change rate is insufficient on the longer wavelength side.

Figure 5A:
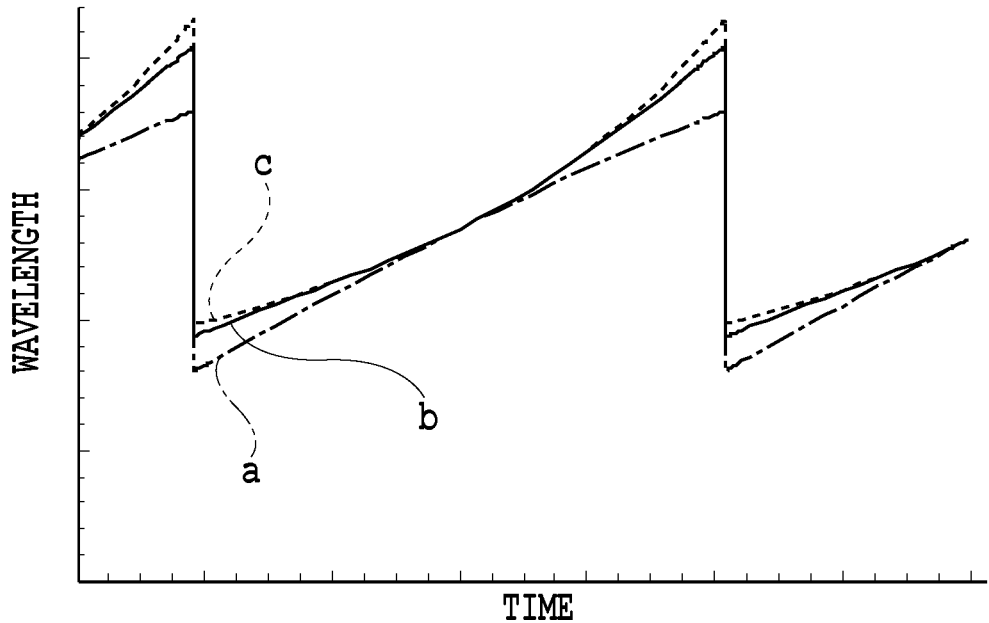
FIG. 5A is a chart showing a second example of time variation in wavelength to be used for the wavelength swept light source having the first configuration of the present invention.
Figure 5B:
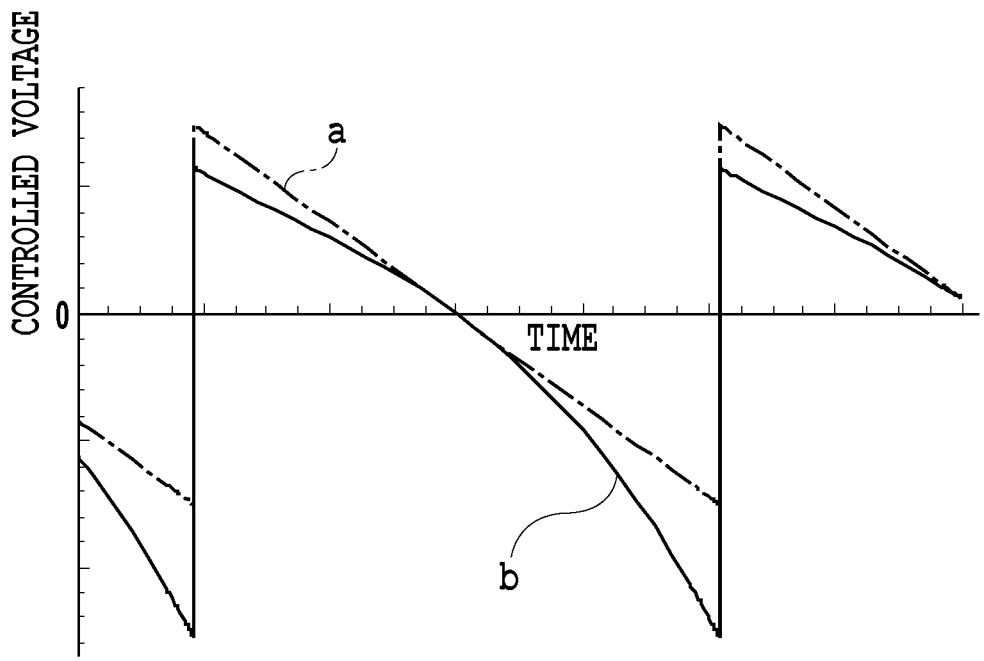
FIG. 5B is a chart showing a second example of time variation in controlled voltage to be used for the wavelength swept light source having the first configuration of the present invention.

FIG. 5A is a chart showing a second example of time variation in wavelength to be often used for the wavelength swept light source having the first configuration of the present invention, whereas FIG. 5B is a chart showing a second example of time variation in controlled voltage to be often used for the wavelength swept light source having the first configuration of the present invention. FIGS. 5A and 5B show a controlled voltage waveform where with respect to a sawtooth waveform as a main waveform, the squared component of the sawtooth waveform and the cubed component of the sawtooth waveform are superimposed. FIG. 5A shows time variation in wavelength, whereas FIG. 5B shows time variation in controlled voltage to be applied by the controlled voltage generator part. The waveform of a dashed line a shows a case (ramp waveform) that only the sawtooth waveform of the well-known art is included. The waveform of a solid line b shows a case that the squared component and the cubed component in the present example are superimposed. The waveform of a dotted line c is the one showing desired variation in wavelength.

In the present example, the cubed component is superimposed with the following amplitude ratio in addition to the squared component having the coefficient expressed with the equation (4). In FIG. 1, the light incident angle into the diffraction grating 109 from the electro-optic deflector 123 is set as $\theta$. The voltage gain of the high voltage amplifier 125 is set as A. Therefore, a product, obtained by multiplying a controlled-voltage-to-deflection-angle sensitivity of the electro-optic deflector 123 as a single component by A, is set as $\gamma$ (rad/V). A controlled voltage waveform b in FIG. 5B is the one that the coefficient of the cubed component of a sawtooth waveform is expressed with the following equation by regulating the gain of the first multiplier 116 to be the coefficient expressed with the equation (4) and by regulating the gain of the second multiplier 118.

equation (5)

$$\gamma^2 \frac{17 + 6\cos 2\theta + \cos 4\theta}{6 \sin^2 2\theta} \quad \text{Math. 6}$$

The above equation is derived by the same procedure as deriving of the aforementioned equation (4), and further, by obtaining a condition that third-order derivative of t at a wavenumber of 1/λ becomes zero.

Figure 6A:
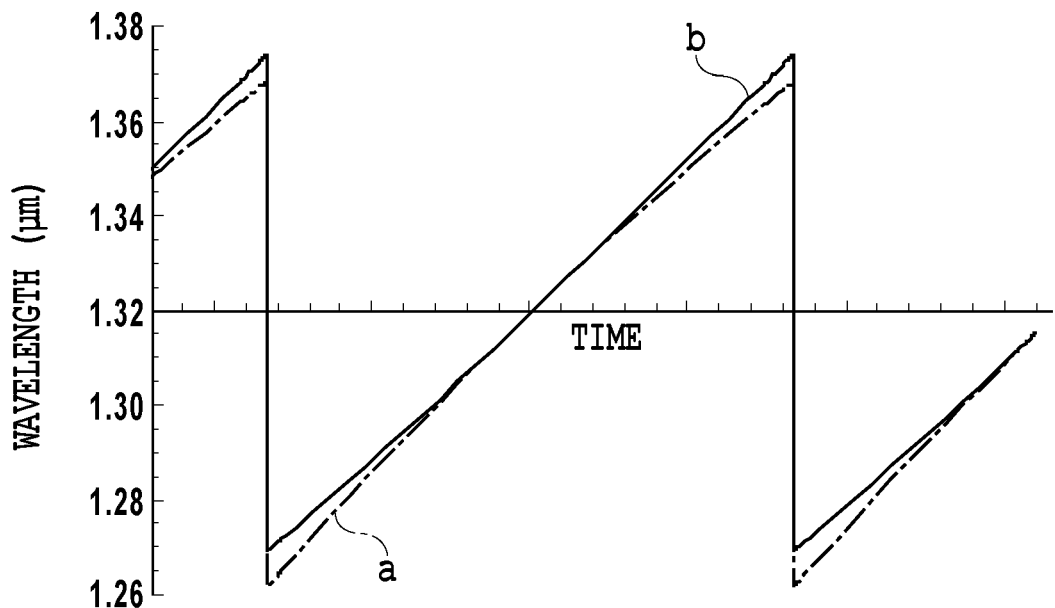
FIG. 6A is a chart showing an example of time variation in wavelength to be used for the wavelength swept light source having the second configuration of the present invention.
Figure 6B:
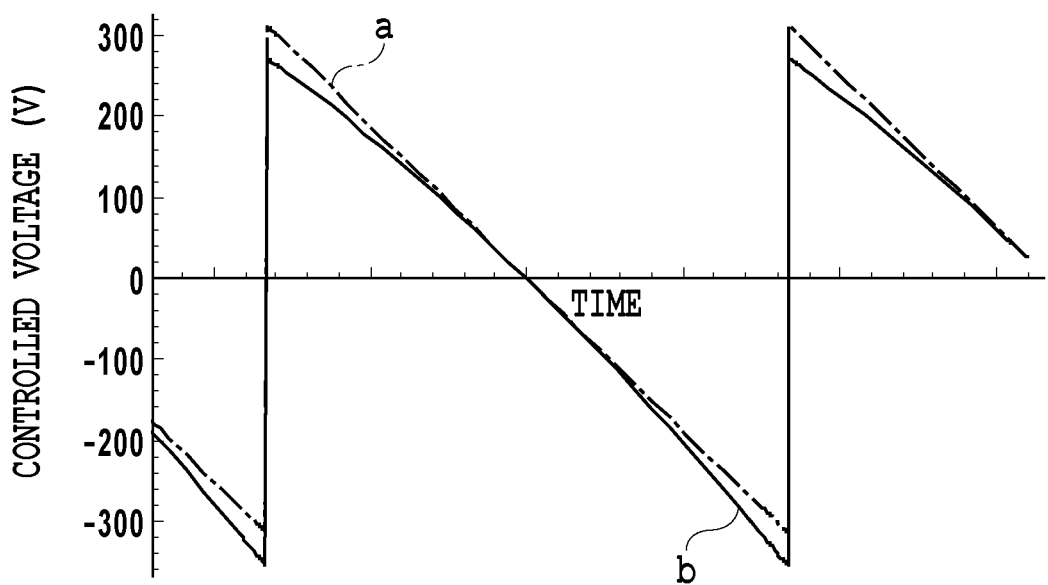
FIG. 6B is a chart showing an example of time variation in controlled voltage to be used for the wavelength swept light source having the second configuration of the present invention.

FIG. 6A is a chart showing an example of time variation in wavelength to be used for the wavelength swept light source having the second configuration of the present invention, whereas FIG. 6B is a chart showing an example of time variation in controlled voltage to be used for the wavelength swept light source having the second configuration of the present invention. FIGS. 6A and 6B show a controlled voltage waveform where with respect to a sawtooth waveform as a main waveform, only the squared component of the sawtooth waveform is superimposed. FIG. 6A shows time variation in wavelength, whereas FIG. 6B shows time variation in controlled voltage to be applied by the controlled voltage generator part. The waveform of a dashed line a shows a case (ramp waveform) that only the sawtooth waveform of the well-known art is applied. The waveform of a solid line b shows a case that the squared component of a sawtooth waveform in the present example is superimposed. In the present example, desired variation in wavelength is not shown because it is matched with the waveform b of the present invention to the extent that it is difficult to distinguishingly depict them on the chart.

A specific configuration of the present example will be described as follows: the diffraction grating has a line density of 300 l/mm; an incident angle θ of 72.2°; an incident angle ϕ of −33.8°; and an operation center wavelength of 1.35 μm. Further, KTN is used as the electro-optic deflector, and the controlled-voltage-to-angle sensitivity γ is 0.17 mrad/V.

In the present example, the squared component is superimposed with the following amplitude ratio. In FIG. 2, the light incident angle into the diffraction grating 106 from the electro-optic deflector 123 is set as θ, while the light incident angle into the diffraction grating 106 from the end surface mirror 110 is set as ϕ. The voltage gain of the high voltage amplifier 125 is set as A. Therefore, a product, obtained by multiplying a controlled-voltage-to-deflection-angle sensitivity of the electro-optic deflector 123 as a single component by A, is set as γ (rad/V). A controlled voltage waveform b in FIG. 6B is the one that the coefficient of the squared component of a sawtooth waveform is expressed with the following equation by regulating the gain of the first multiplier 116.

equation (6)

$$\gamma \frac{3 + \cos2\theta + 2\sin\phi\sin\theta}{2(\sin2\theta + 2\sin\phi\cos\theta)} \qquad \text{Math. 7}$$

The above equation is derived by obtaining a condition that a second-order derivative of t at a wavenumber of 1/Δ becomes zero around a zero of a function δ(t) of time (t), regarding Λ(sin(θ+δ)+sin ϕ)=mλ that is the diffraction grating equation of the second configuration.

As is obvious from FIGS. 6A and 6B, in the wavelength swept light source having the second configuration (Littman configuration) of the present invention, it is possible to obtain such controlled voltage that the waveform thereof is roughly matched with a desired waveform by superimposing, with respect to a sawtooth waveform as a main waveform, only the squared component of the sawtooth waveform having the coefficient expressed with the equation (6).

However, for further improvement, similarly to the first configuration, it is preferable to further superimpose the cubed component having the coefficient expressed with the following equation in addition to the squared component having the coefficient expressed with the equation (6). In other words, the coefficient of the cubed component of a sawtooth waveform may be expressed with the following equation by regulating the gain of the first multiplier 116 to be the coefficient expressed with the equation (6) and by regulating the gain of the second multiplier 118.

equation (7)

$$21 - 4\cos2\phi + 26\sin\phi\sin\theta + \\ \gamma^2 \frac{2(2 + \cos2\phi)\cos2\theta + 2\sin\phi\sin3\theta + \cos4\theta}{6(\sin2\theta + 2\sin\phi\cos\theta)^2} \qquad \text{Math. 8}$$

The above equation is derived by the same procedure as deriving of the aforementioned equation (6), and further, by obtaining a condition that third-order derivative of t at a wavenumber of 1/κ becomes zero. As is obvious from the equations (4) to (7), in the method of correcting the controlled voltage of the electro-optic deflector in the present invention, exponential components (squared component, cubed component) of a sawtooth waveform to be superimposed are determined by only the arrangement configuration (θ,ϕ) of the diffraction grating 106, 109 and its periphery in the oscillator part 201, 211. Therefore, the controlled voltage waveform can be corrected without depending on the amplitude and the period of a sawtooth waveform as a main waveform for performing a wavelength sweep. As a result, the wavelength swept range can be flexibly changed by changing the amplitude of the sawtooth waveform. A desired controlled voltage waveform can be generated only by setting the coefficient of the squared component and that of the cubed component through the regulation of the gains of the multipliers 116 and 118. As a result, as the oscillation wavelength is shifted to the loner wavelength side, the oscillation wavelength varies more quickly and time variation in oscillation wavelength is formed in a downwardly convex shape. In other words, time variation in oscillation wavelength is controlled so that it can linearly vary with respect to the wavenumber. Therefore, in application to SS-OCT, it is possible to obtain a sharp OCT image with good linearity in the depth direction of a living organism as an object.

More specific working examples will be hereinafter described.

Working Example 1

Figure 7:
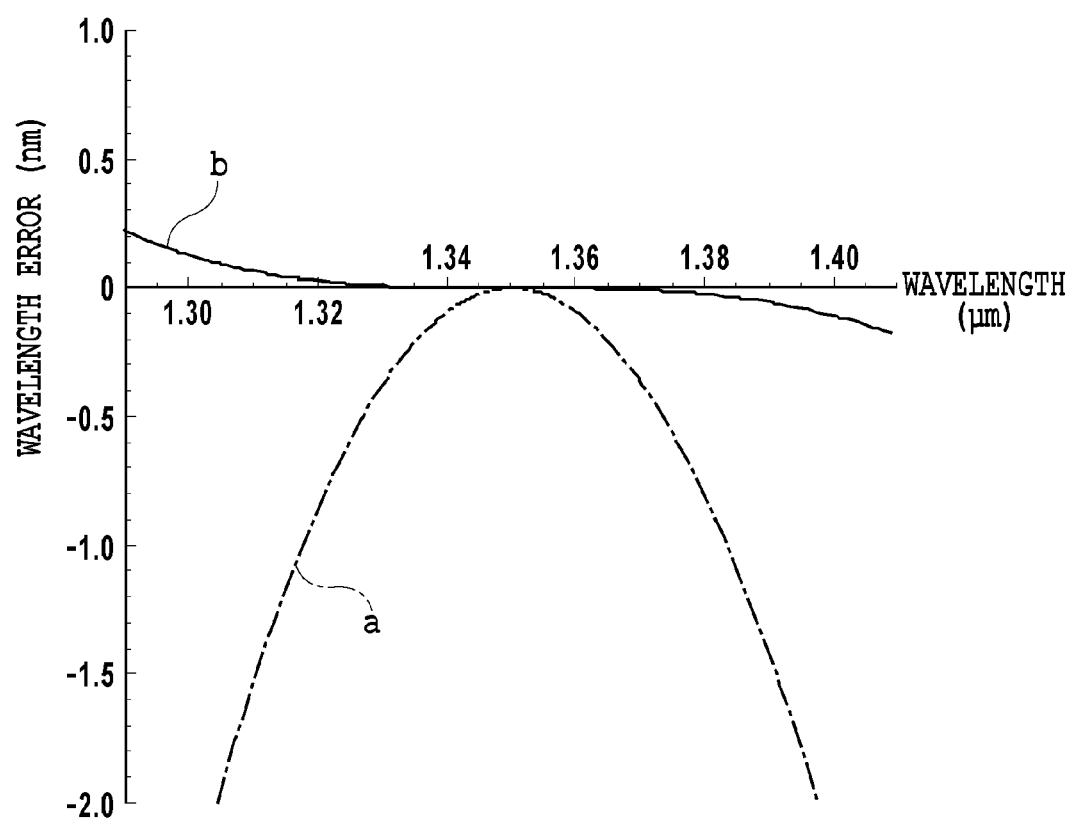
FIG. 7 is a chart showing a wavelength error where correction including only a squared component is performed in the wavelength swept light source having the first configuration in a working example 1.

FIG. 7 is a chart showing a waveform error where correction with only the squared component is performed for controlled voltage in a working example 1 by the wavelength swept light source having the first configuration. The present working example is produced by the first configuration shown in FIG. 1 and has the following configuration: the diffraction grating has a line density of 300 l/mm; an incident angle θ of 35.0°; and an operation center wavelength of 1.35 μm. Only the second component was set as an exponential component, and the gain of the first multiplier 116 was regulated so that the squared component can have the coefficient represented with the equation (4). A dashed line a shows an error of wavelength variation from desired wavelength variation, where a sweep was performed by the controlled voltage having a sawtooth waveform of the well-known art. A solid line b shows an error of wavelength variation from desired wavelength variation, where correction was performed by superimposing only the squared component. According to the present working example, roughly ideal wavelength variation could be obtained in a width range of 100 nm about a wavelength of 1.35 μm.

Figure 8:
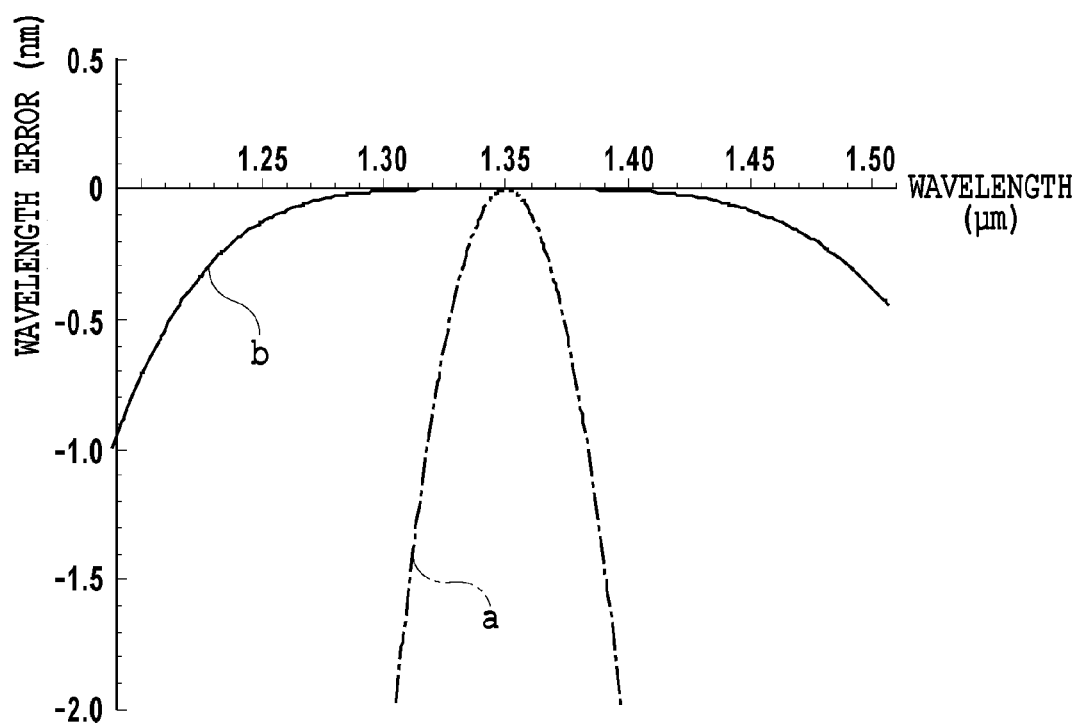
FIG. 8 is a chart showing a wavelength error where correction including components up to a cubed component is performed in the wavelength swept light source having the first configuration in the working example 1.

FIG. 8 is a chart showing a wavelength error where correction including components up to the cubed component was performed in the working example 1 by the wavelength swept light source having the first configuration. To further superimpose the cubed component in addition to the squared component shown in FIG. 7, the gain of the second multiplier 118 was regulated so that the cubed component could have the coefficient expressed with the equation (5). A dashed line a shows an error of wavelength variation from desired wavelength variation, where a sweep was performed by controlled voltage having a sawtooth waveform of the well-known art. A solid line b shows an error of wavelength variation from desired wavelength variation, where correction was performed by superimposing the squared component and the cubed component. According to the present working example, roughly ideal wavelength variation could be obtained in a width range of 200 nm wider than that in FIG. 7 about a wavelength of 1.35 μm. In the present working example, a wavelength error is remarkably improved in comparison with: a case of using a polygon mirror of the well-known art; and a wavelength swept light source where controlled voltage, including only a simple sawtooth waveform, is applied to the electro-optic deflector.

Working Example 2

Figure 9:
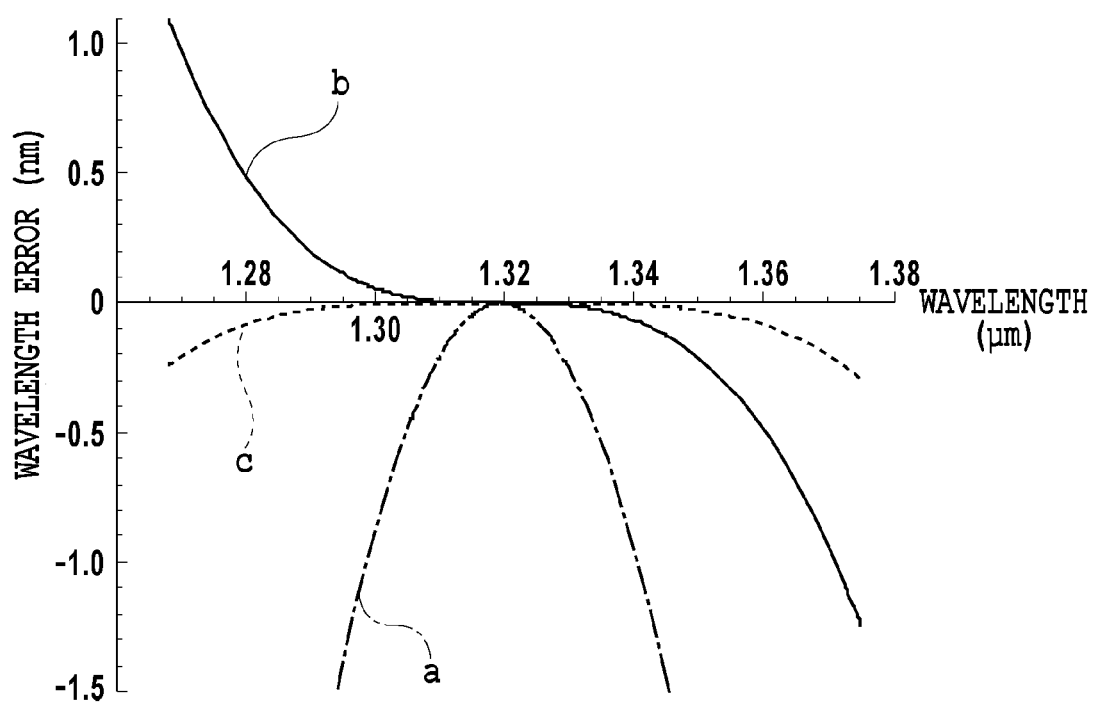
FIG. 9 is a chart showing a wavelength error in the wavelength swept light source having the second configuration in Embodiment 2.

FIG. 9 is a chart showing a wavelength error in a working example 2 by the wavelength swept light source having the second configuration. The present working example is produced by the second configuration shown in FIG. 2 and has the following configuration: the diffraction grating has a line density of 300 l/mm; the incident angle θ is 72.2°; the incident angle φ is −33.8°; and the operation center wavelength is 1.32 μm. In relation to exponential components, the gain of the first multiplier 116 was regulated so that the squared component could have the coefficient expressed with the equation (6), whereas the gain of the second multiplier 118 was regulated so that the cubed component could have the coefficient expressed with the equation (7).

A dashed line a shows an error of wavelength variation from desired wavelength variation, where a sweep was performed by controlled voltage having a sawtooth waveform of the well-known art. A solid line b shows an error of wavelength variation from desired wavelength variation, where correction was performed by superimposing only the squared component. A solid line c shows an error of wavelength variation where correction was performed by superimposing the cubed component in addition to the squared component. Among them, when correction including components up to the cubed component was performed, wavelength variation more approximate to ideal one was implemented in a wide range.

Figure 10:
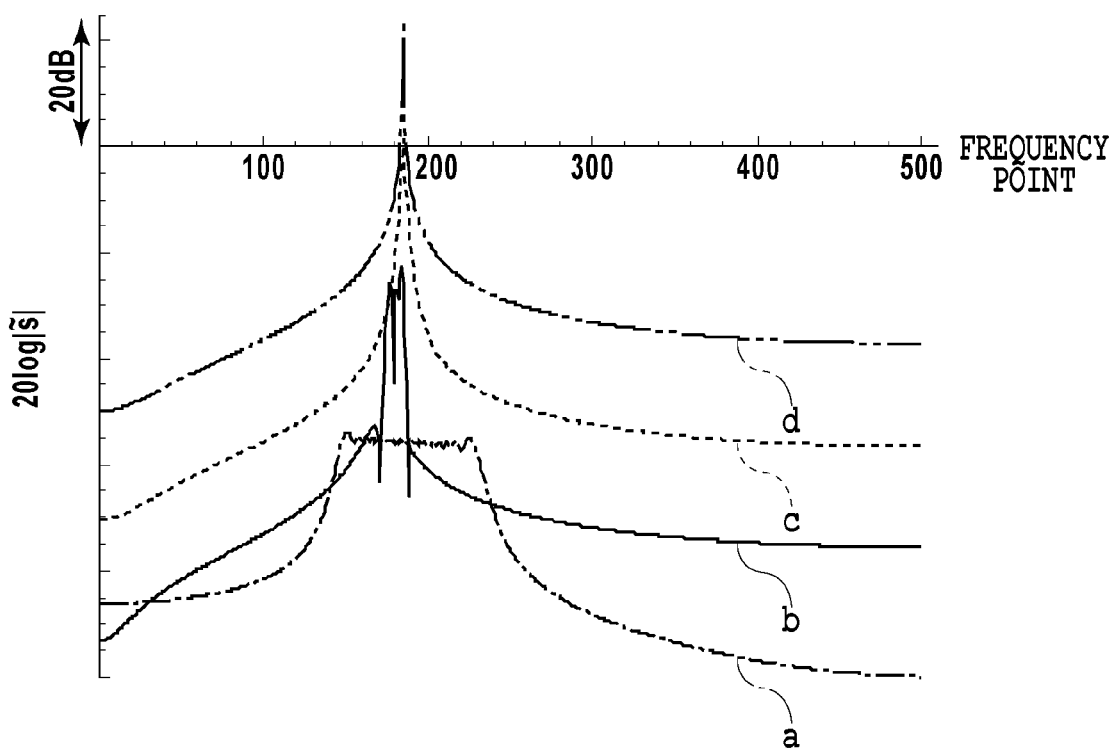
FIG. 10 is a chart showing a point spread function to be obtained by OCT using the wavelength swept light source in a working example 2.

FIG. 10 is a chart showing a PSF obtained by OCT using the wavelength swept light source in the working example 2. A PSF (Point Spread Function) in FIG. 10 shows an OCT image to be obtained when a single reflection surface exists at a predetermined depth within an object in SS-OCT using the wavelength swept light source in the working example 2. The PSF is obtained by calculating the interference waveform of SS-OCT using the wavelength swept light source, which represents time variation in wavelength to be produced by the controlled voltage generated by the configuration in the working example 2, and by performing discrete Fourier transform of the interference waveform. More specifically, the reflection surface depth is set to be 1.5 mm (an optical path length difference of 3.0 mm) in the air, and interference data of 1000 points are obtained at equal time intervals during a wavelength sweep of 100 nm. This corresponds to a case that interference data of 1000 points are obtained during a single scan of controlled voltage to be applied to the electro-optic deflector. Through the discrete Fourier transform, an OCT image composed of 500 points is obtained in the depth direction within an object.

In FIG. 10, the calculated Fourier amplitude, converted to dB, is displayed on the vertical axis. For easy distinction, four types of waveform plots a to d are displayed, while being shifted away from each other by 20 dB in the vertical axis direction. A dotted line a shows a PSF where a sweep was performed by controlled voltage including only a sawtooth waveform of the well-known art. A solid line b shows a PSF where a sweep was performed by controlled voltage corrected by superimposing only the squared component, and corresponds to the case of the wavelength error b in FIG. 9. A solid line c shows a PSF where a sweep was performed by controlled voltage corrected by superimposing the squared component and the cubed component, and corresponds to the case of the wavelength error c in FIG. 9. A dashed lined shows a PSF where a sweep was performed by controlled voltage having ideal desired wavelength variation.

As is obvious from the respective PSFs in FIG. 10, a sharp PSF is obtained where the controlled voltage in the working example 2 is applied to the electro-optic deflector, in comparison with the case of the well-known art that the PSF is expanded in the depth direction. Particularly, in the case of c in which components up to the cubed component are included, the PSF rather approximates to an ideal state.

Working Example 3

Figure 11:
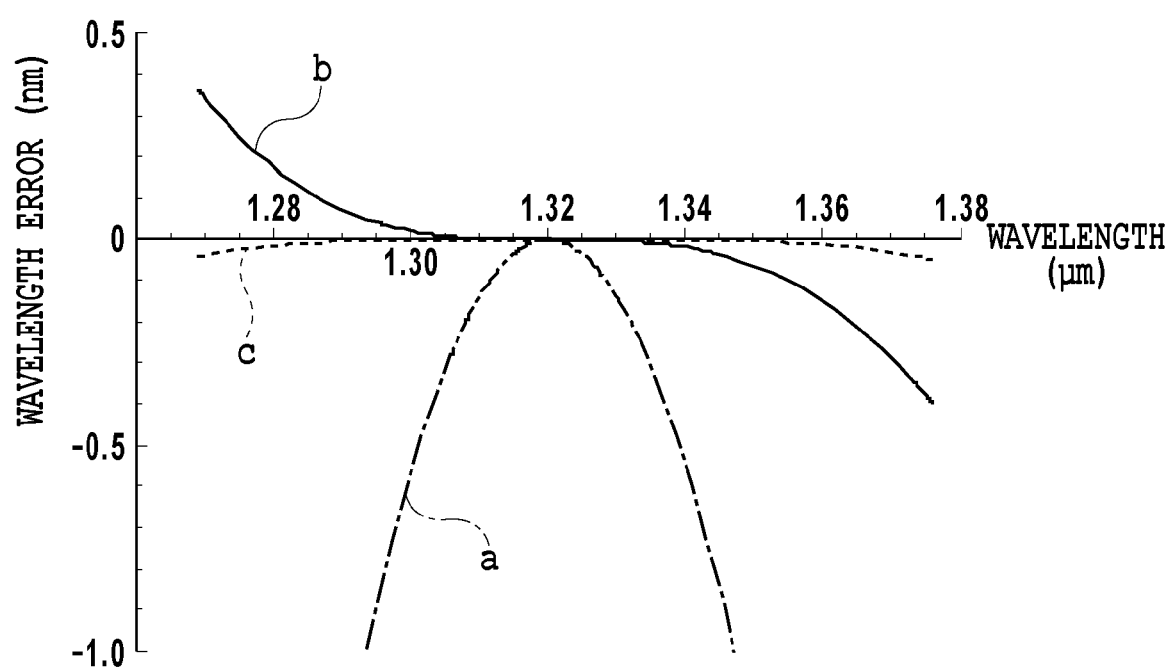
FIG. 11 is chart showing a wavelength error in the wavelength swept light source having the second configuration in a working example 3.

FIG. 11 is a chart showing a wavelength error in the working example 3 by the wavelength swept light source having the second configuration. The present working example is produced by the second configuration shown in FIG. 2 and has the following configuration: the diffraction grating has a line density of 600 l/mm; the incident angle θ is 52.31°; the incident angle φ is 0.04°; and the operation center wavelength is 1.32 μm. The present working example is different from the working example 2 in that the incident angle θ is smaller and the groove density of the diffraction grating is doubled. Similarly to the working example 2, in relation to exponential components, the gain of the first multiplier 116 was regulated so that the squared component could have the coefficient expressed with the equation (6), whereas the gain of the second multiplier 118 was regulated so that the cubed component could have the coefficient expressed with the equation (7).

A dashed line a shows an error of wavelength variation from desired wavelength variation, where a sweep was performed by controlled voltage having a sawtooth waveform of the well-known art. A solid line b shows an error of wavelength variation from desired wavelength variation, where correction was performed by superimposing only the squared component. A solid line c shows an error of wavelength variation where correction was performed by superimposing the cubed component in addition to the squared component. It is understood that wavelength errors are remarkably reduced in the respective curves of the working example 3 in comparison with the respective curves in FIG. 9 including the wavelength error in the working example 2. As described below, this can be considered to be due to that the incident angle θ for achieving a filter effect required within the oscillator can be reduced in the oscillator part 211 shown in FIG. 2.

With reference now to FIG. 2 again, in the wavelength swept light source having the second configuration, the oscillation wavelength λ is determined by the following equation.

$$\Lambda(\sin(\theta+\delta)+\sin\phi)=m\lambda \qquad \text{equation (8)}$$

Here, Λ is set as the pitch of the diffraction grating; λ is set as the oscillation wavelength; and m is set as the diffraction order. As shown in FIG. 2, θ and φ are set as the incident and outgoing angles into and from the diffraction grating. δ is set as the change angle of the incident angle into the diffraction grating to be received by the electro-optic deflector. As explained for the well-known art using the equation (2), the variation shape of the wavelength λ is affected by a sine term including θ on the left side of the equation (8). In the working example 3, the incident angle θ could be reduced. Reduction in wavelength error in the aforementioned working example 3 can be considered to be due to that the undesired upwardly convex variation shape (curvature), attributed to the sine term, is originally less curved in proportion to reduction in θ.

Figure 12:
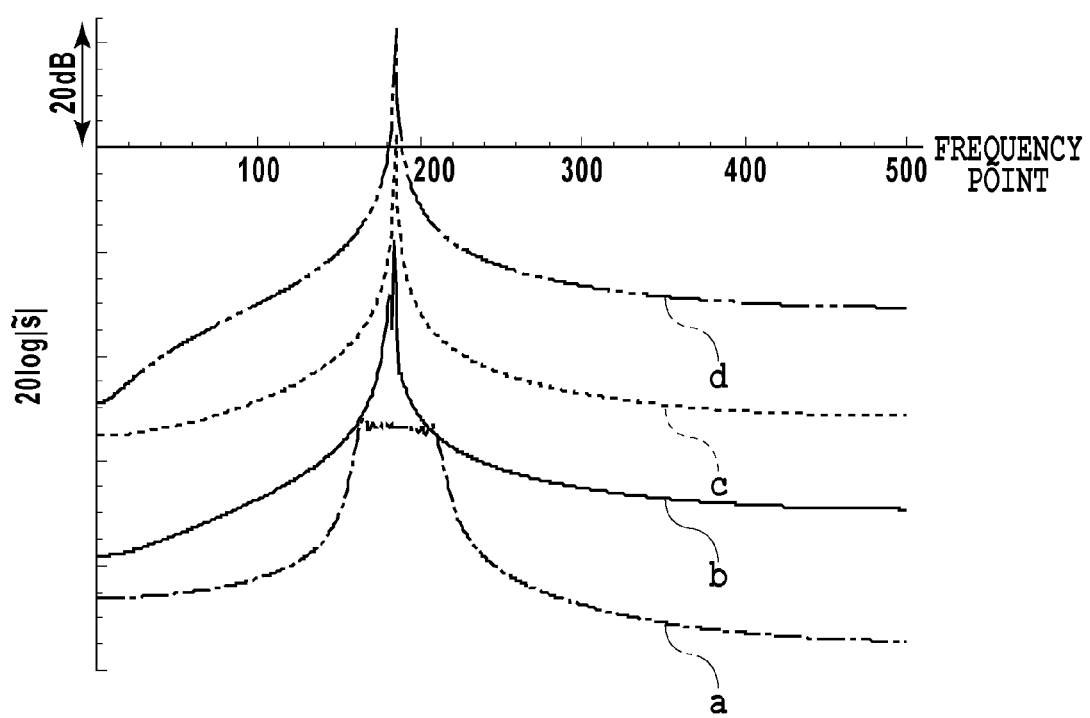
FIG. 12 is a chart a showing point spread function to be obtained by OCT using the wavelength swept light source in the working example 3.
Figure 13:
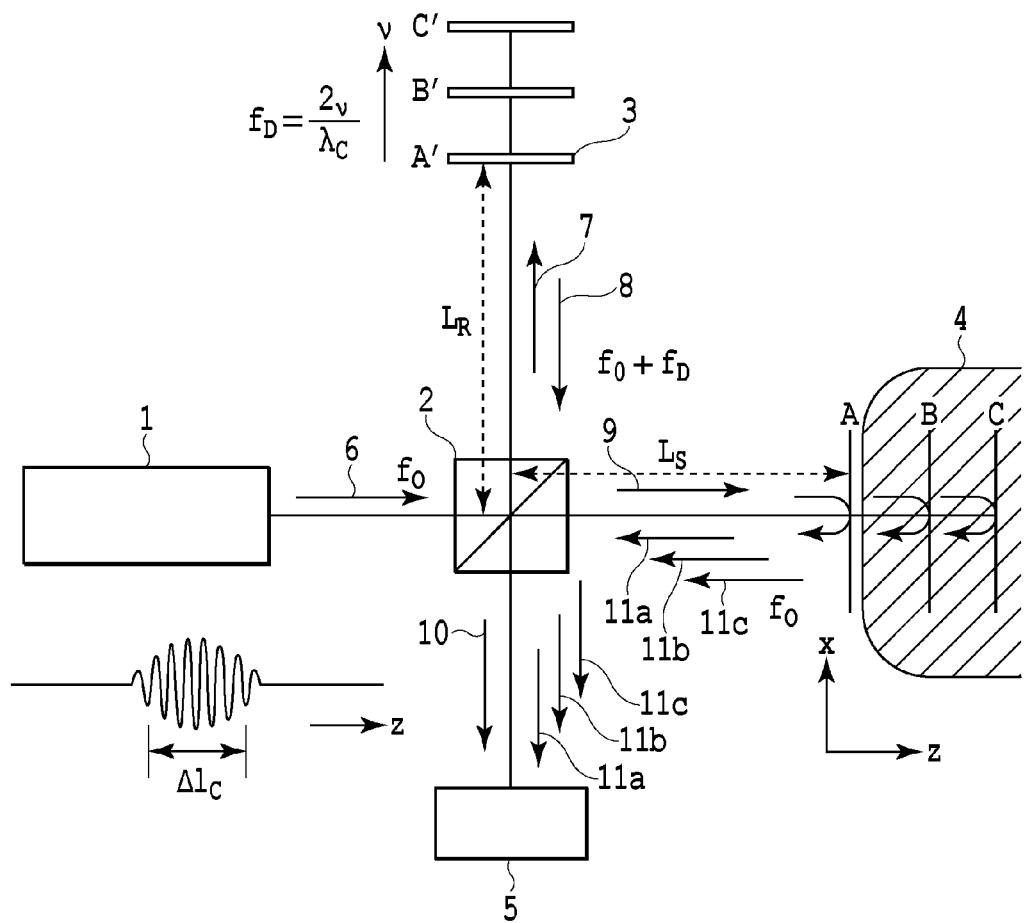
FIG. 13 is a diagram explaining the basic principle of OCT.
Figure 14:
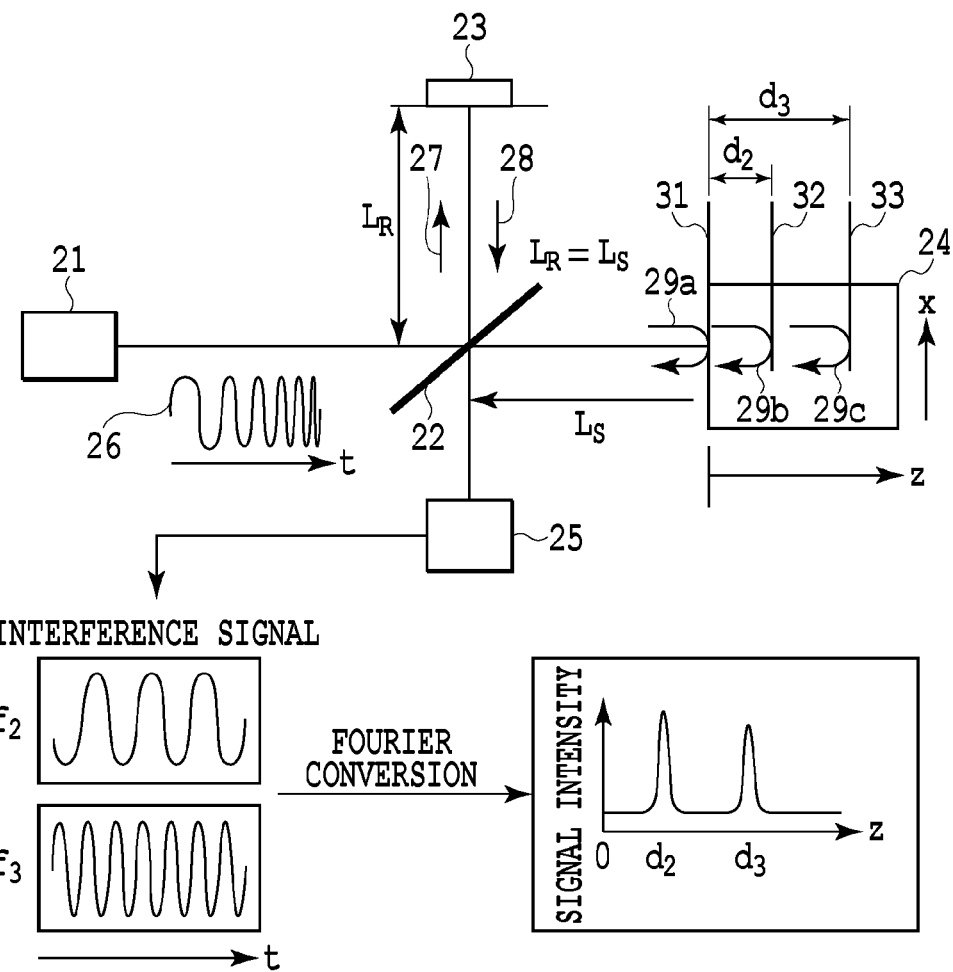
FIG. 14 is a diagram schematically showing the principle of SS-OCT.
Figure 15:
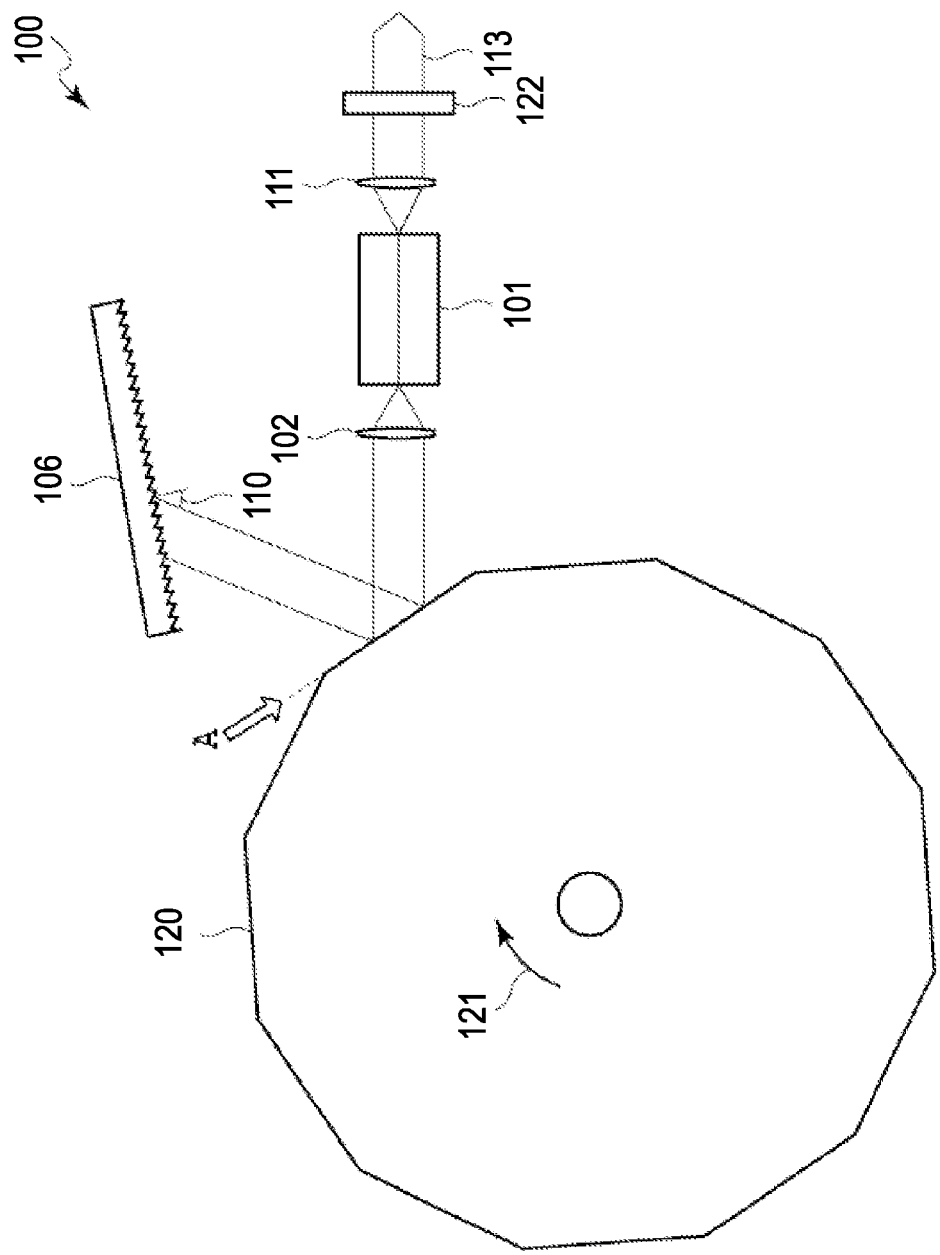
FIG. 15 is a diagram showing a configuration of a wavelength swept light source using a polygon mirror of a well-known art.

FIG. 12 is a chart showing a PSF obtained by OCT using the wavelength swept light source in the working example 3. Similarly to FIG. 10, the calculated Fourier amplitude, converted to dB, is displayed on the vertical axis. For easy distinction, four types of waveform plots a to d are displayed, while being shifted away from each other by 20 dB on the vertical axis. A dotted line a shows a PSF where a sweep was performed by controlled voltage including a sawtooth waveform of the well-known art. A solid line b shows a PSF where a sweep was performed by controlled voltage corrected by superimposing only the squared component, and corresponds to the case of the wavelength error b in FIG. 11. A solid line c shows a PSF where a sweep was performed by controlled voltage corrected by superimposing the squared component and the cubed component, and corresponds to case of the wavelength error c in FIG. 11. A dashed lined shows a PSF where a sweep was performed by controlled voltage having ideal desired wavelength variation.

In comparison with the case of the working example 2 shown in FIG. 10, a sharper PSF could be obtained in both of the cases of: the waveform b that only the squared component is superimposed; and the waveform c that components up to the cubed component are superimposed. Particularly, when the controlled voltage including components up to the cubed component is applied to the electro-optic deflector, a PSF becomes very sharp and much approximates to such state that an ideal OCT image can be obtained.

As described above, a PSF obtained by OCT can be kept sharp by correcting the controlled voltage to be applied to the electro-optic deflector of the wavelength swept light source so that time variation in oscillation wavelength can linearly vary with respect to the wavenumber. The aforementioned corrected controlled voltage can be easily generated by superimposing, with respect to a sawtooth waveform as a main waveform, one or more exponential components of the sawtooth waveform. Specifically, it is sufficient to superimpose, with respect to a sawtooth waveform as a main waveform, either only the squared component of the sawtooth waveform or the squared and cubed components of the sawtooth waveform. When thus corrected controlled voltage is utilized in the wavelength swept light source, as the oscillation wavelength is shifted to the longer wavelength side, the oscillation wavelength varies more quickly and time variation in oscillation wavelength is formed in a downwardly convex shape. In the wavelength swept light source of the present invention, a swept wavelength was configured to be controlled so that it could linearly vary with respect to the wavenumber on the time axis.

In the aforementioned configurations of the wavelength swept light source of the present invention, as shown in the controlled voltage generator part 202, 212, analog electric circuits such as the multiplier and the accumulator are used for correcting controlled voltage by generating one or more exponential components of a sawtooth waveform. However, the method of generating and accumulating one or more exponential components is not limited to the above. For example, it is also possible to generate controlled voltage by an arbitrary waveform generator based on numerically calculated data.

In the method of correcting the controlled voltage of the electro-optic deflector according to the present invention, the coefficient (ratio) of each exponential component to be superimposed depends on only the arrangement of the diffraction grating and its periphery without depending on the amplitude and the period of the sawtooth waveform. Therefore, the method is characterized in that the wavelength swept range can be flexibly changed by changing the amplitude of the sawtooth waveform.

Further, the configurations of the oscillator parts 201 and 211 are variously changed, and are not limited to those in FIGS. 1 and 2. In other words, the following should be noted: the invention of the present application is characterized in that, where the oscillation wavelength λ of the wavelength swept light source roughly linearly varies over time with respect to controlled voltage, the controlled voltage is corrected to result in such wavelength variation that the wavenumber linearly varies with respect to time.

As described above in detail, according to the present invention, it is possible to provide a wavelength swept light source whereby wavelength variation suitable for SS-OCT can be achieved. With use of wavelength swept voltage having a profile that wavelength variation linearly varies with respect to the wavenumber, the linearity of an OCT image can be remarkably improved and a sharp OCT image can be obtained.

Next, as represented in the equation of Math. 9, the wavenumber (K) of laser oscillation is expressed using a function of the deflection angle (θ) of the outgoing light from the KTN deflector.

$$k=k_0+k_1\theta+k_2\theta^2+k_3\theta^3 \qquad \text{Math. 9}$$

θ is a function of the applied voltage (V) to the KTN deflector, and it is ideal that θ is proportional to V. However, their relation is deviated from the proportional relation due to such impact as the incompleteness of the KTN deflector and the aberration of a compensation lens. Therefore, as represented in Math. 2, it is more realistic for θ rather to consider a higher-order term of voltage as perturbation.

$$\theta=\theta_0+\theta_1 V+\theta_2 V^2+\theta_3 V^3 \qquad \text{Math. 10}$$

Here, it should be noted that, when Math. 10 is substituted in the equation of Math. 9, even up to a quadratic term of V is rapidly complicated as represented in the equation of Math 11.

$$k=k_0+k_1\theta_0+k_2\theta_0^2+k_3\theta_0^3+(k_1\theta_1+2k_2\theta_0\theta_1+3k_3\theta_0^2\theta_1)V+ \\ (k_2\theta_1^2+3k_3\theta_0\theta_1^2+k_1\theta_2+2k_2\theta_0\theta_2+3k_3\theta_0^2\theta_2)V^2+O \\ (V^3) \qquad \text{Math. 11}$$

Here, from the electrical point of view, the KTN deflector is equivalent to a condenser having a capacitance of several nF. When the KTN deflector is driven with a voltage of several hundred bolts at a frequency of several hundred kHz, it is more advantageous to drive the KTN deflector by a resonant circuit composed of a condenser, a resistor and a coil than by a power source for generating an arbitrary waveform by reducing output impedance from the perspective of the power consumption and the size of the power source. It should be noted that only a sine wave is allowed to be generated when the KTN deflector is driven by only the aforementioned resonant circuit. Therefore, a realistically adoptable method is to use a resonant frequency as a fundamental and superimpose the resonant frequency and its harmonic/harmonics onto DC voltage while the amplitude and/or the phase of the harmonic/harmonics is/are being regulated.

Where a wavelength sweep is temporally and periodically performed with an angular frequency ω, a voltage pattern is expressed with the equation of Math. 12 when a fundamental and a harmonic/harmonics is/are superimposed onto DC offset voltage.

$$V = V_{DC} + V_{prim}\cos\omega t + \sum_{m=2}^{\infty} V_m \cos(m\omega t + \phi_m)$$ Math. 12

$$V_{DC}$$ Math. 13

$$V_{prim}\cos\omega t$$ Math. 14

Here, when Math. 10 and Math. 12 are substituted into Math. 9, the wavenumber is given as a function of time where the respective wavelength components and the phase of applied voltage are set as parameters. However, when the wavenumber is expressed as a function of time, the function will be inevitably a complex function including $\{k_i\}$, $\{\theta_i\}$ and $\{V_i\}$ in the respective frequency components.

Further, when the output impedance in the circuit for superimposing a harmonic/harmonics of a resonant frequency is not sufficiently small, the phase delay or the amplitude of each harmonic inevitably depends on values of load and voltage. In this case, it is more effective to adopt a method of performing a feedback control based on a measured value of time dependency of the wavenumber for gradually approximating time dependency of the wavenumber to that with a predetermined value in comparison with adopting a method of determining time dependency of the wavenumber using $\{k_i\}$, $\{\theta_i\}$ and $\{V_i\}$ determined separately and independently. The method corresponds to determination of coefficients $\{f_m\}$ and $\{\Phi_m\}$ represented in Math. 15 where the wavenumber (k) is set as a function of the respective frequency components $\{f_m\}$ and the phase shift $\{\Phi_m\}$ of applied voltage.

$$k(t) = f_0 + \sum_{m=1}^{M} f_m \cos(m\omega t + \Phi_m)$$ Math. 15

It should be noted that in the equation of Math. 15, M is set as the upper limit indicating to what extent a harmonic should be applied. Here, M=10 is set.

Figure 17:
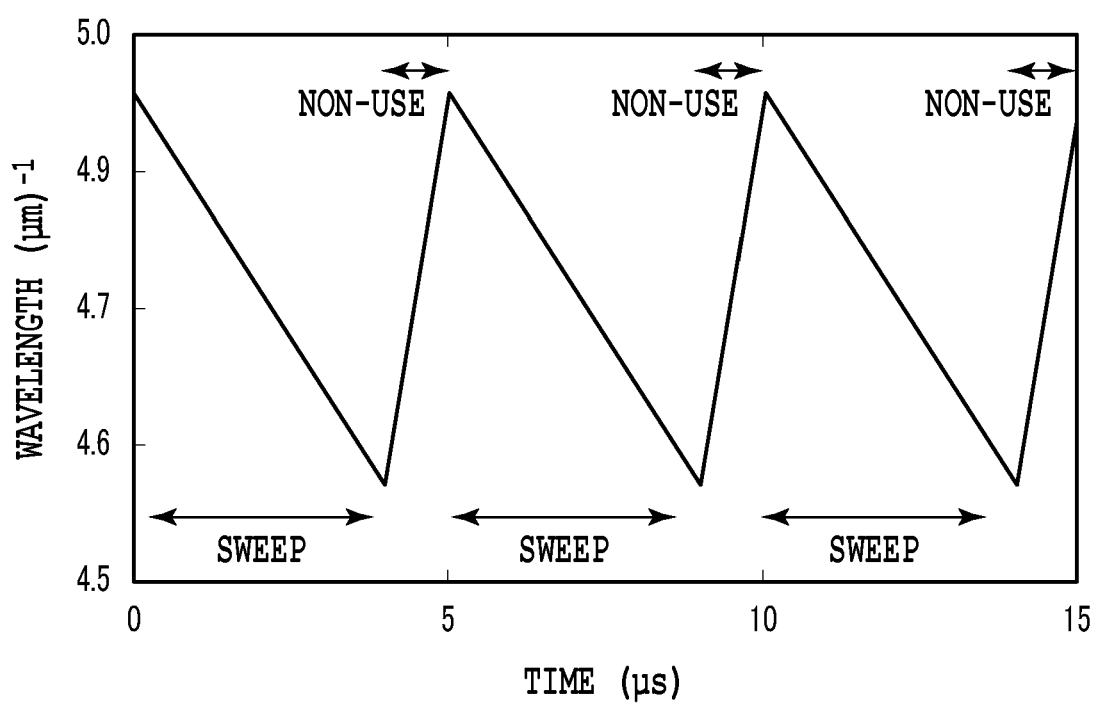
FIG. 17 is a chart showing time dependency of wavenumber.

Explanation will be made by exemplifying a case that a wavelength sweep is repeatedly performed at 200 kHz by setting the center wavelength to be around 1320 nm and setting the wavelength swept width to be 100 nm with use of a KTN deflector having a capacitance of 2 nF. Here, as shown in FIG. 17, regulation is configured to be performed during a sweep so that the wavenumber temporally varies at a constant speed from a short wavelength (λ=1270 nm, k=4.947×10$^6$ m$^{-1}$) to a long wavelength (λ=1370 nm, k=4.586×10$^6$ m$^{-1}$). For a sweep from the short wavelength to the long wavelength, 4 µs is used that corresponds to 80% of a sweep period of 5 µs (corresponding to 200 kHz). The long wavelength is transitioned to the short wavelength in the remaining 1 µs, but time dependency at this time is not required.

Figure 18:
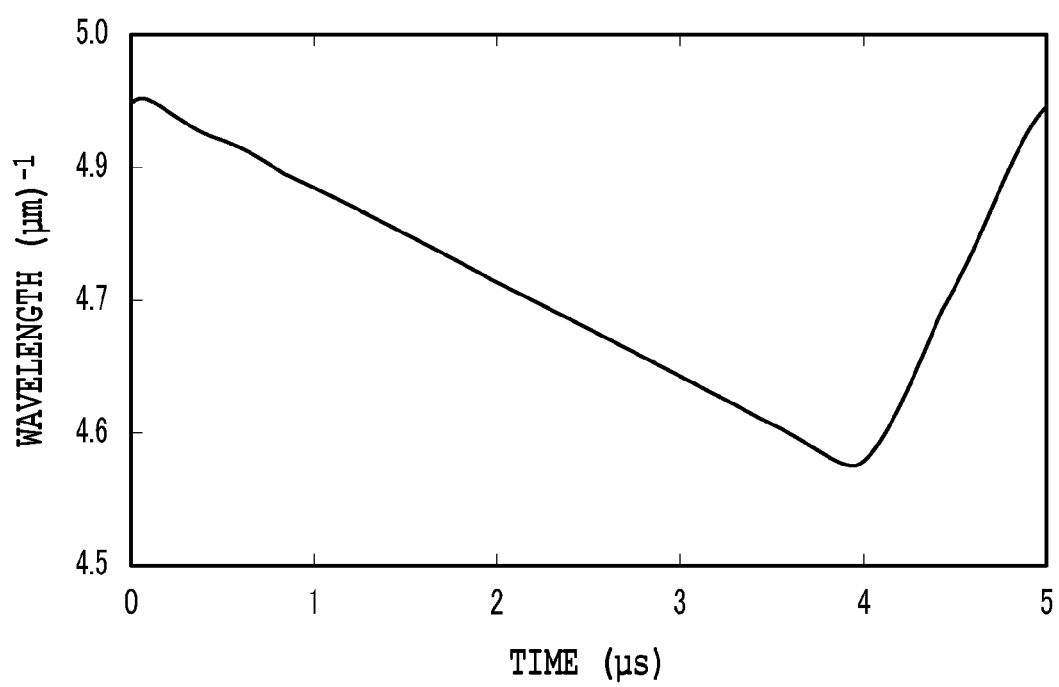
FIG. 18 is a chart showing a waveform onto which harmonics up to a tenth-order harmonic are superimposed in the case of FIG. 17.

FIG. 18 is a chart that only one period in the waveform of FIG. 17 is duplicated where M=10, i.e., where harmonics up to a tenth-order harmonic are superimposed. The waveform in FIG. 18 is free of superimposed harmonics of the eleventh order or greater, and is therefore formed in a slight dull shape. Even when the wavenumber is caused to temporally vary at a constant speed, variation in waveform where M=10 is limited to the extent shown in FIG. 18.

Next, explanation will be made for a case that an optical system is regulated so that the incident angle with respect to the normal of the grating can be 60° where the line density of the grating is set to be 600 l/mm; and the applied voltage to the KTN deflector is set to be 0 V. In this case, the wavelength swept width exceeds 100 nm when a voltage of ±400 V is applied to the KTN deflector. The voltage is set as reference. In other words, where 1≤m≤10, a value obtained from the right side in Math. 16, $$\frac{800}{(4.947 - 4.586) \times 10^6} = 0.00221607$$ Math. 16 i.e., 0.002216 is multiplied to wavenumber variation to be obtained, and a resultant product is applied as voltage.

When the waveform of FIG. 18 as a target waveform is Fourier-transformed, this can be expressed as the equation of Math. 17.

$$\tilde{k}_m = \int_0^{5us} k_{Target}(t)\exp(im\omega t)dt$$ Math. 17

It should be noted that the waveform of FIG. 18 is expressed with Math. 18.

$$k_{Target}(t)$$ Math. 18

Based on Math. 17, Math. 19 is used for the initial value of amplitude and that of phase regarding the fundamental and the respective harmonics of applied voltage.

$$f_m = 0.00221607|\tilde{k}_m|$$

$$\Phi_m = \arg(\tilde{k}_m)$$ Math. 19

The wavenumber of output light varies in accordance with the aforementioned voltage pattern. Wavenumber variation at this time is measured using a method disclosed in the following document (i.e., a method of sampling a voltage waveform at equal wavenumber intervals) (Step 1). Wavenumber variation is expressed with Math. 20.

$$k_{Meas}(t)$$ Math. 20

(Document) Yoshiaki Yasuno, Violeta Dimitrova Madjarova, Shuichi Makita, Masahiro Akiba, Atsushi Morosawa, Changho Chomg, Toni Sakai, Kin-Pui Chan, Masahide Itoh and Toyohiko Yatagai, "Three-dimensionalo and high-speed swept-source optical coherence tomography for in vivo investigation of human anterior eye segments," Optics Express, 10652, Vol. 13, No. 26, 2003

Next, Fourier transform ($K_m$) of wavenumber variation expressed with Math. 20 is calculated with reference to the equation of Math. 17 (Step 2).

Next, $\Delta_m$ expressed with Math. 21 is calculated (Step 3).

$$\Delta_m = k_m - K_m$$ Math. 21

Next, the initial values of fundamental and harmonics of applied voltage are obtained, which are given where the value of the left side to be obtained in Math. 22 is set anew as $k_m$.

$$k_m' = k_m + \Delta_m \qquad \text{Math. 22}$$

Time dependency of the wavenumber is obtained by repeating the steps 1 to 3 regarding $k_m$ given anew. Accordingly, time dependency of the wavenumber approximates to the waveform shown in FIG. 18.

Working Example 5

Next, explanation will be made for a wavelength swept light source that an etalon filter is set in a resonator as a wavelength swept light source according to an embodiment (third embodiment).

Figure 19:
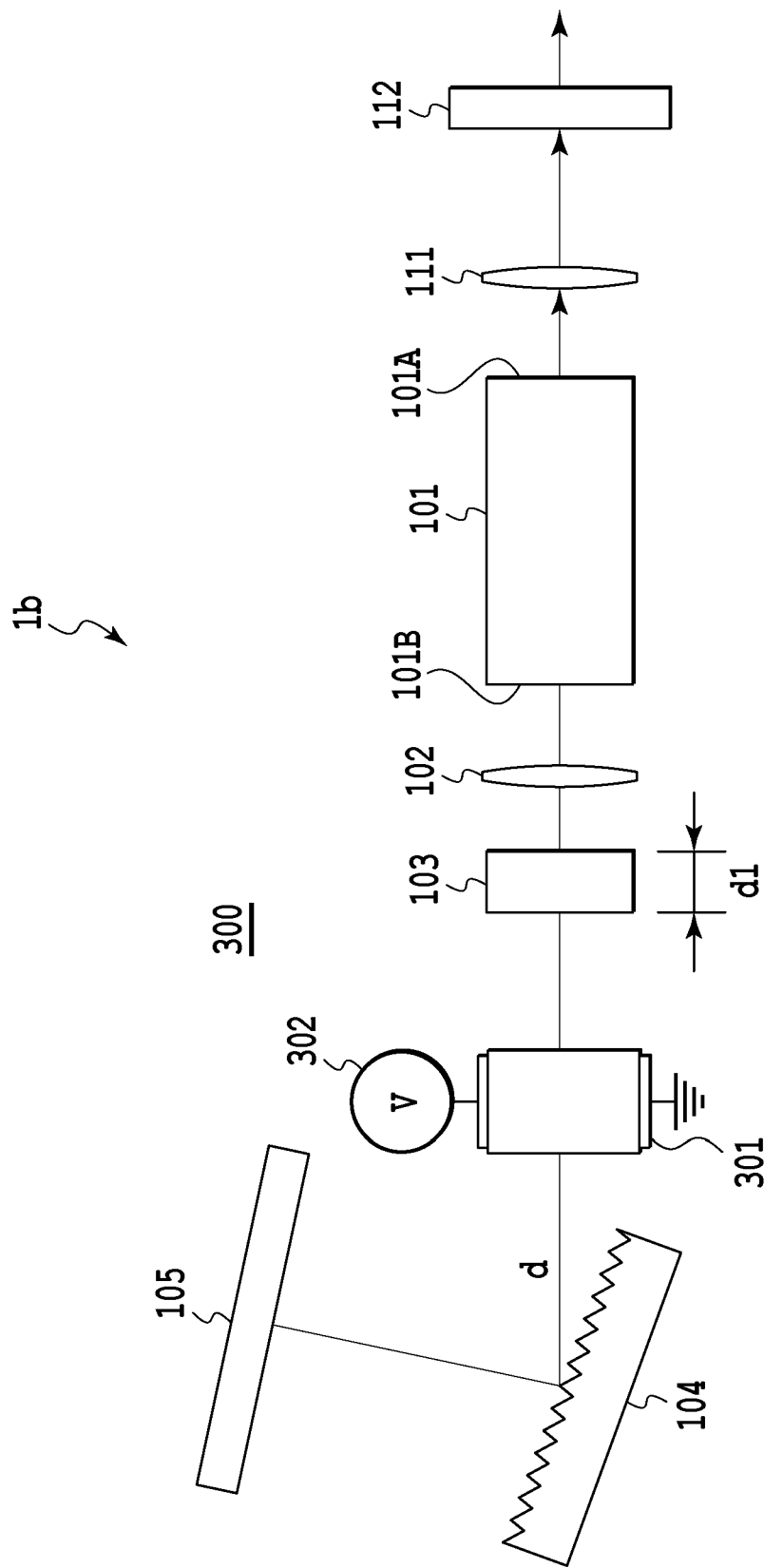
FIG. 19 is a diagram showing a configuration of a wavelength swept light source according to a third embodiment.

FIG. 19 is a diagram showing a configuration of a wavelength swept light source 1b according to the present embodiment. The present wavelength swept light source 1b includes: a resonator 300; the first collective lens 111 for outputting the light inputted therein from the resonator 300 in the form of parallel light; and an optical isolator 112 allowing only the light inputted therein from the first collective lens 111 to transmit therethrough as output light s1. Further, the resonator 300 is configured by including an electro-optic deflector 301 and a controlled voltage source 302 connected to the electro-optic deflector 301. As described above, the electro-optic deflector 301 is a deflector using, for instance, a potassium tantalate niobate ($KTa_{1-x}Nb_xO_3$ (0<x<1): KTN) crystal, a ($K_{1-y}Li_yTa_{1-x}Nb_xO_3$ (0<x<1, 0<y<1): KLTN) crystal or the like. Each of the KTN crystal and the KLTN crystal has a large permittivity and achieve a high electro-optic effect, and therefore, the refractive index thereof can be changed by voltage application. It should be noted that FIG. 19 shows an exemplary case of the resonator 300 configured with a Littman arrangement.

A LD (Laser Diode) 101, having a laser medium for exciting a gain medium, is disposed inside the resonator 300. In FIG. 19, a partial reflection coating (HR) is applied to a first end surface 101A of the LD located on the outer side of the resonator 300, whereas an anti-reflection coating (AR) is applied to a second end surface 101B of the LD located on the inner side of the resonator 300.

The resonator 300 includes the second collective lens 102, an etalon filter 103 (second resonator), a diffraction grating 104 and a mirror 105 (reflective mirror).

Light transmitted through the second end surface 101B of the LD enters the second collective lens 102, which is configured such that incident light exits therefrom in the form of parallel light.

The etalon filter 103 is configured to allow transmission of only the light having a predetermined frequency band (wavelength band) among lights oscillated within the resonator 300. In the present embodiment, as an example, the etalon filter 103 is made of a cubic glass, and films with a reflectivity of roughly 30% are applied to both of the etalon filter's coated end surfaces through which light transmits. Explanation will be made below for the light output characteristic of the etalon filter 103.

The diffraction grating 104 is configured to select the wavelength of light inputted therein. In FIG. 19, the diffraction grating 104, having sawtooth grooves for instance, diffracts incident light having a desired wavelength.

When voltage is applied to the electro-optic deflector 301 from the controlled voltage source 302, the refractive index of the electro-optic deflector 301 varies and the path of light transmitting through the electro-optic deflector 301 also varies.

FIG. 19 is a diagram showing the resonator length and the etalon filter length. As shown in FIG. 19, the resonator length of the resonator 300 is distance d between the first end surface 101A and the mirror 105.

On the other hand, the etalon filter length of the etalon filter 103 is distance d1 between the both coated end surfaces of the etalon filter 103. In the explanation of the present embodiment, as an example, the distance d is set to be 10 cm, while the distance d1 is set to be 5 mm. In other words, the relation d1<d is established.

Figure 20:
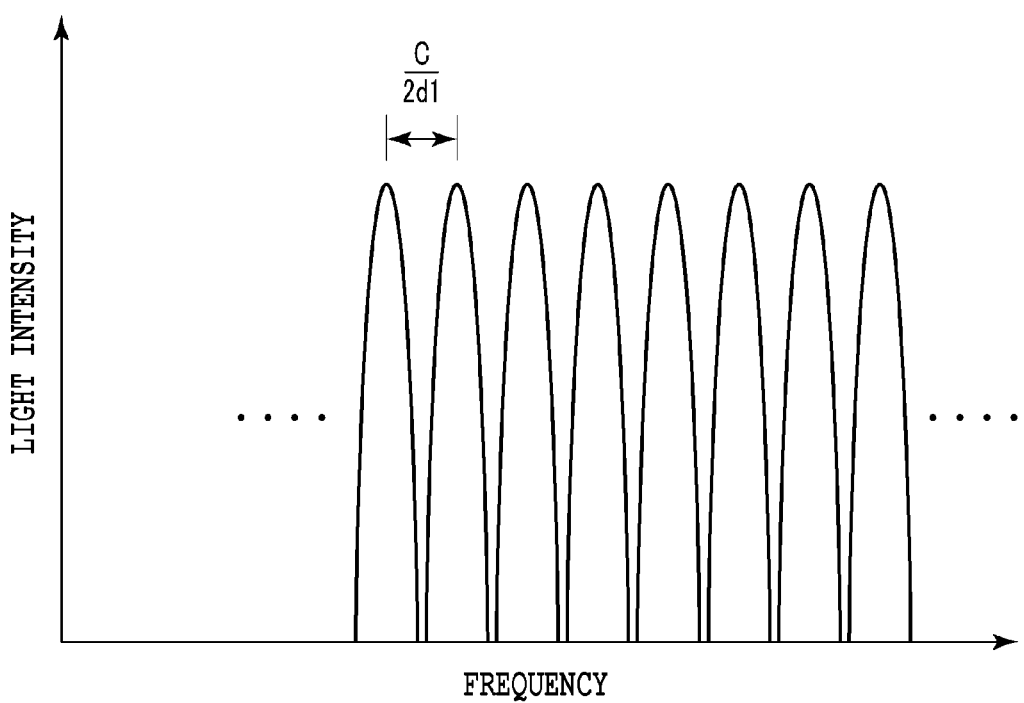
FIG. 20 is a chart showing a resonance characteristic of an etalon filter.

FIG. 20 is a chart showing the resonance characteristic of the etalon filter. FIG. 20 shows the output characteristic under the etalon filter length d1 where the frequency of light transmitting through the etalon filter 103 is represented as the horizontal axis while the intensity of the transmitting light is represented as the vertical axis.

As shown in FIG. 20, the light transmitting through the etalon filter transmits at frequency intervals of c/(2d1) where the light speed in the etalon filter is set as c. In other words, as shown in FIG. 20, the output characteristic of the etalon filter 103 becomes a comb-like characteristic that allows transmission of only a predetermined frequency. For example, where d1=5 mm, a frequency interval of c/(2d1) corresponds to 20 GHz.

Figure 21:
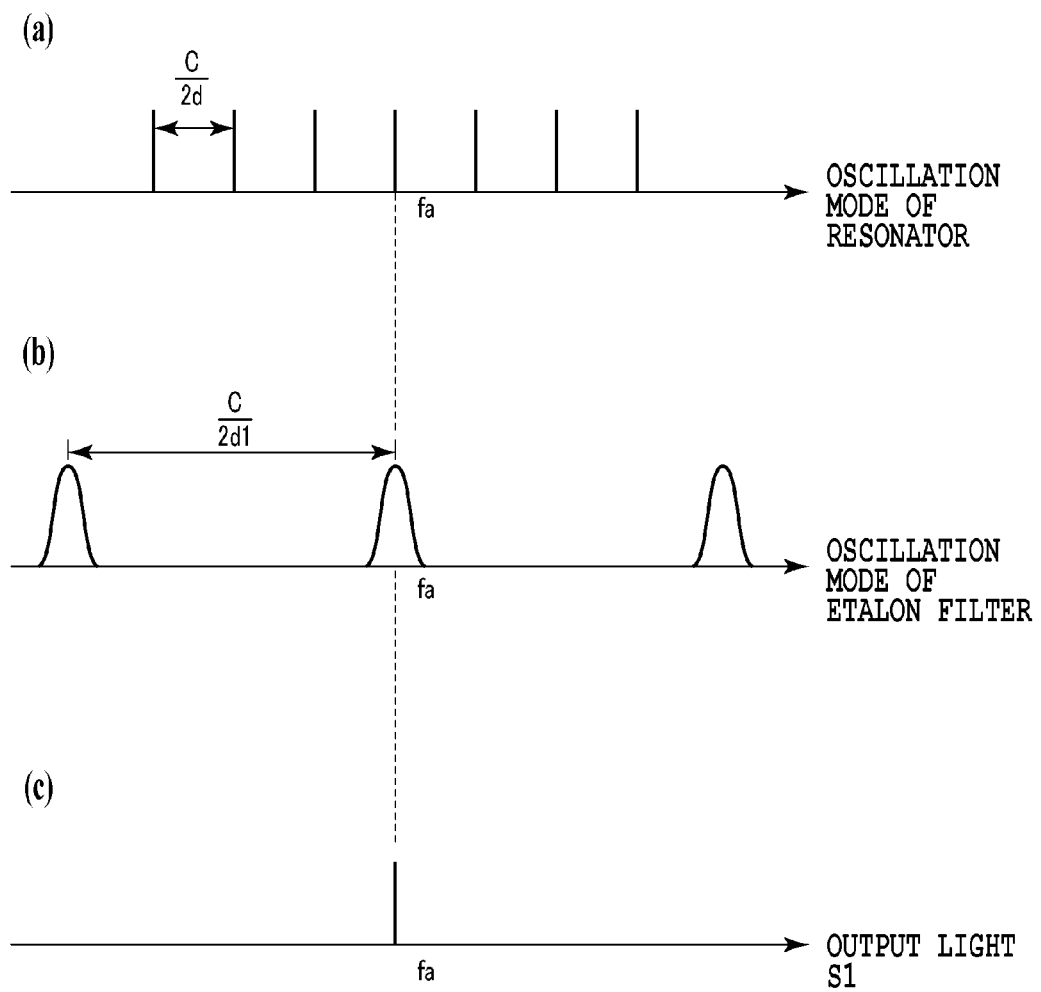
FIG. 21 is a chart showing output light of the wavelength swept light source.

FIG. 21 is a chart showing the output light of the wavelength swept light source. In FIG. 21, (a) is a chart showing the oscillation mode of the resonator; (b) is a chart showing the oscillation mode of the etalon filter; and (c) is a chart showing the output light s1 of the wavelength swept light source 1b. In the respective charts, the frequency is represented as the horizontal axis, while the light intensity is represented as the vertical axis.

In the oscillation mode of the resonator (first oscillation mode) shown in FIG. 21(a), light (depicted with straight lines for easy drawing) is oscillated at frequency intervals of c/(2d) where the light speed in the resonator is set as c under the resonator length d of FIG. 19.

On the other hand, in the oscillation mode of the etalon filter (second oscillation mode) shown in FIG. 21(b), light is oscillated at frequency intervals of c/(2d1). Therefore, the frequency interval thereof becomes longer than that of FIG. 21(a).

When lights with different frequency intervals are thus oscillated, the output light s1 (depicted with a straight line for easy drawing) of the wavelength swept light source is oscillated at a frequency (e.g., fa) that the oscillation mode of the resonator and that of the etalon filter are matched as shown in FIG. 21(c). Therefore, in the wavelength swept light source 1b, light can be intermittently outputted at the frequency intervals of the oscillation mode of the etalon filter.

Further, in the wavelength swept light source according to the present embodiment, the oscillation mode of the etalon filter 103 in FIG. 21(b) continues to grow, and therefore, the frequency of the oscillation mode of the resonator in FIG. 21(a) is pulled towards the center frequency of the oscillation mode of the etalon filter 103. Accordingly, the power of the output light s1 in FIG. 21(c) is stabilized.

Figure 22:
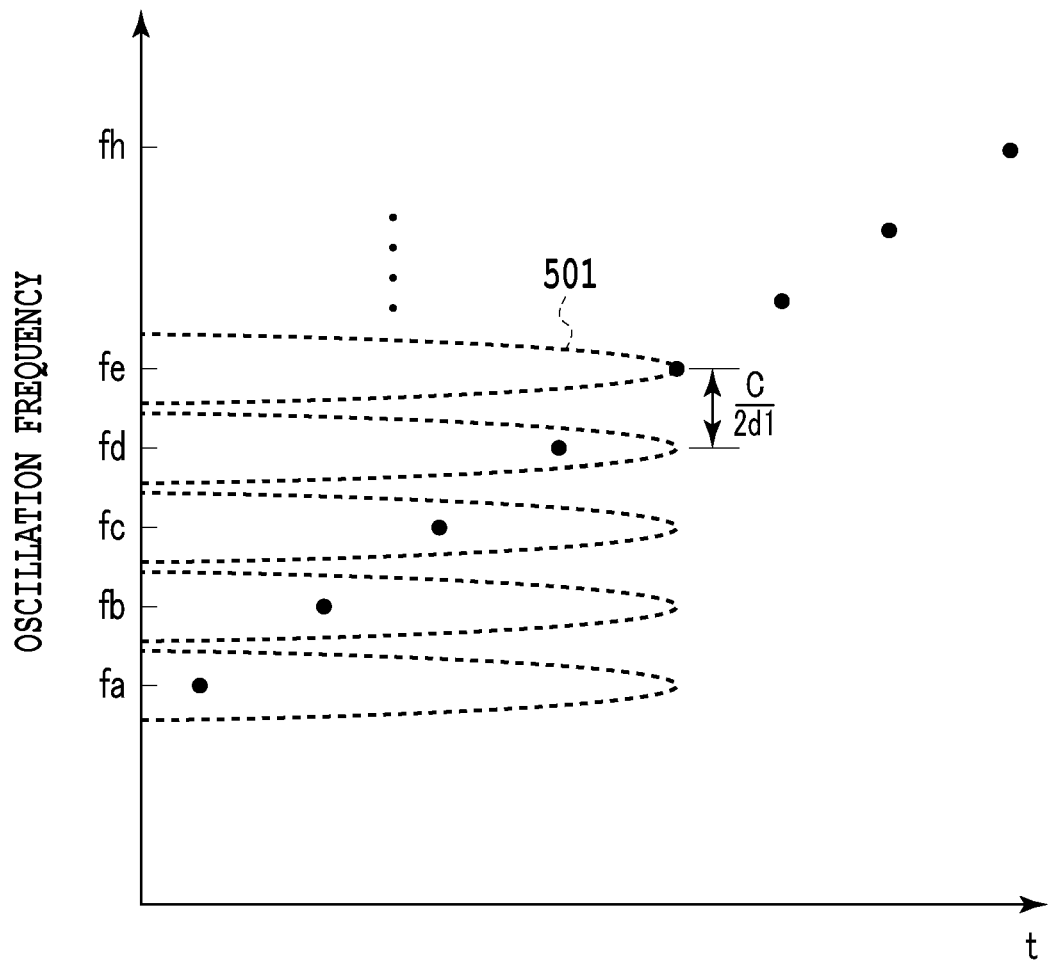
FIG. 22 is a chart showing a frequency characteristic of the output light of the wavelength swept light source.

FIG. 22 is a chart showing the frequency characteristic of the output light s1 of the wavelength swept light source. The frequency characteristic is shown where the output time t of the output light s1 of the wavelength swept light source 1b is represented as the horizontal axis while the oscillation frequency of the respective output lights is represented as the vertical axis, where the etalon filter 103 in FIG. 19 is provided; the etalon filter length is set to be d1; and the center frequencies of the oscillation mode of the etalon filter 103 are set to be fa, fb, fc, fd, fe, Fh. Further, in the frequency characteristic shown in FIG. 22, the output characteristic 501 (where the light intensity is represented as the horizontal axis, while the oscillation frequency is represented as the vertical axis) of the etalon filter 103 is depicted with dashed lines.

It should be noted that FIG. 22 partially shows the frequency characteristic of the output light s1 of the wavelength swept light source. However, in the explanation of the present embodiment, as an example, the frequency width is set to fall in a range from 240 THz (the wavelength is 1250 nm) to 222 THz (the wavelength is 1350 nm).

Thus, the output light s1 of the wavelength swept light source 1b is intermittently oscillated at a frequency with an interval of c/(2d1). Therefore, the frequency band widths of the respective output lights are narrowed.

Therefore, even when the output light s1 of the wavelength swept light source 1b is measured for a predetermined period of time, the wavelength (frequency) at the start of the measurement and the wavelength at the end of the measurement are enabled to less easily vary, and measurement errors attributed to variation in oscillation wavelength is less easily produced. Further, it is possible to intermittently observe the output light having a frequency at which the light intensity is maximized, i.e., a desired frequency (e.g., fa, fb or the like with an interval of c/(2d1)). Therefore, it is possible to obtain the observation data that are roughly liner with respect to the optical frequency.

Figure 23:
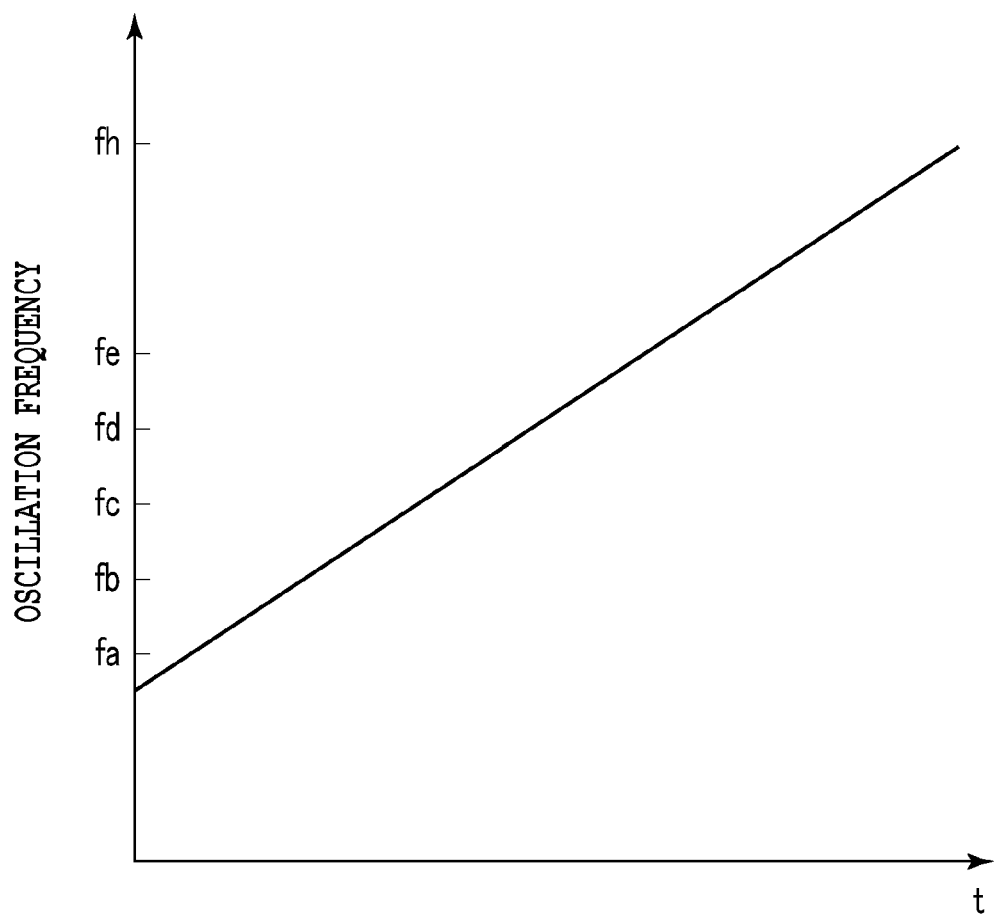
FIG. 23 is a chart showing a frequency characteristic of the output light of the wavelength swept light source where no etalon filter is disposed within a resonator in FIG. 10.

By contrast, when the etalon filter 103 is not disposed within the resonator 300, the frequency interval of the oscillation mode of the resonator is not changed, and therefore, the frequency characteristic of the output light of the wavelength swept light source becomes a continuous characteristic as shown in FIG. 23. Therefore, where the etalon filter 103 is not disposed, the output light of the wavelength swept light source has a wider frequency band width (frequency spectrum width) in comparison with that of the output light s1 in FIG. 23. Accordingly, there easily occur measurement errors attributed to variation in a measurement start value and variation in a measurement end value of the oscillation wavelength (frequency). Further, chances become less that the output light having only a desired frequency is intermittently observed.

Working Example 6

In the third embodiment, the case has been explained that the wavelength swept light source is provided with a single etalon filter. However, a plurality of etalon filters may be provided inside or outside the resonator.

In this case, when the resonant frequencies of the respective etalon filters are matched, such matched frequencies still occur at constant frequency intervals. Therefore, light with a desired frequency can be exited at constant frequency intervals by the oscillation frequency.

Alternatively, a plurality of etalon filters can be dispersedly disposed inside and outside the resonator of the third embodiment.

Working Example 7

With reference to the third embodiment, explanation has been made above for the case that light with a desired frequency is intermittently outputted at constant frequency intervals. However, it could be confirmed that the wavelength swept light sources of the respective embodiments also had the feature that the coherence length during a wavelength sweep is not degraded in comparison with the coherence length before the wavelength sweep. In other words, it could be confirmed that the line width of an oscillation spectrum did not vary between before and during a wavelength sweep.

With reference to FIGS. 19 and 24 to 26, explanation will be hereinafter made for such feature by exemplifying the wavelength swept light source 1b of the third embodiment.

The wavelength swept light source of the present working example has an entire structure similar to that shown in FIG. 19. In other words, the wavelength swept light source 1b of the present working example includes the resonator 300, the respective collective lenses 102 and 111, the etalon filter 103, the diffraction grating 104, the mirror 105, the optical isolator 112 and the electro-optic deflector 301. In the present working example, a SOA (Semiconductor Optical Amplifier), for instance, was used as the LD 101.

The etalon filter 103 in the present working example has a glass with a thickness of 2.0 mm and a refractive index of 1.5. The glass was configured such that its light incident surface and its light outgoing surface are both set to have a reflectivity of 30%.

Figure 24:
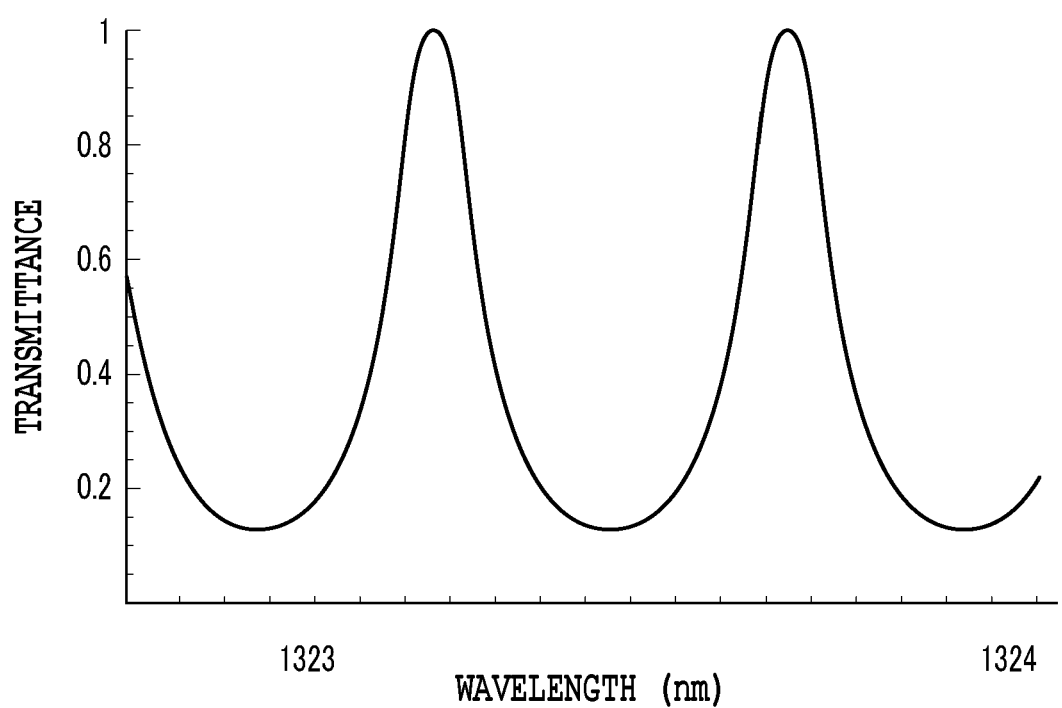
FIG. 24 is a chart showing an exemplary relation between the input wavelength and the transmittance of an actually set-in etalon filter in the third embodiment.

FIG. 24 is a chart showing an exemplary relation between the input wavelength and the transmittance of the etalon filter 103. It should be noted that the wavelength is represented as the horizontal axis while the transmittance is represented as the vertical axis.

As shown in FIG. 24, in the etalon filter 103, the transmittance is configured to periodically vary with respect to the wavelength. In this case, the full width half maximum of a transmission spectrum in each period is configured to be always constant.

In the present working example, the diffraction grating 104 is set to have a grating pitch of, for instance, 600 l/mm.

For example, a KTN optical scanner capable of performing a high speed deflection operation was used as the electro-optic deflector 301. The KTN optical scanner changes the incident angle into the diffraction grating 104 for making the oscillation wavelength variable. In the present working example, a flat sheet structure of 4(l)×3(w)×1(t) mm$^3$, for instance, was employed as the chip shape of the KTN optical scanner. Further, Ti/Pt/Au electrodes were formed on the respective faces (both of the front and back faces) with an area of 4(l)×3(w) mm$^2$ of the KTN crystal, and an electric field was configured to be applied in the thickness direction. Further, a region in which the KTN crystal forms a cubical crystal system was configured to have a permittivity of roughly 20000 by controlling the operating temperature of KTN using a Peltier temperature controller. Yet further, in the present working example, a sine wave voltage, set to have a frequency f of 200 kHz and a potential Vpp of 600 V, was applied to the KTN. Accordingly, the wavelength swept light source 1b of the present working example was enabled to perform a wavelength sweep at a high frequency of 200 kHz in a broad band.

Next, the wavelength swept light source 1b of the present working example was operated and a wavelength sweep characteristic was observed through the measurement by a light spectrum analyzer. Explanation will be hereinafter made for the observational result.

Figure 25A:
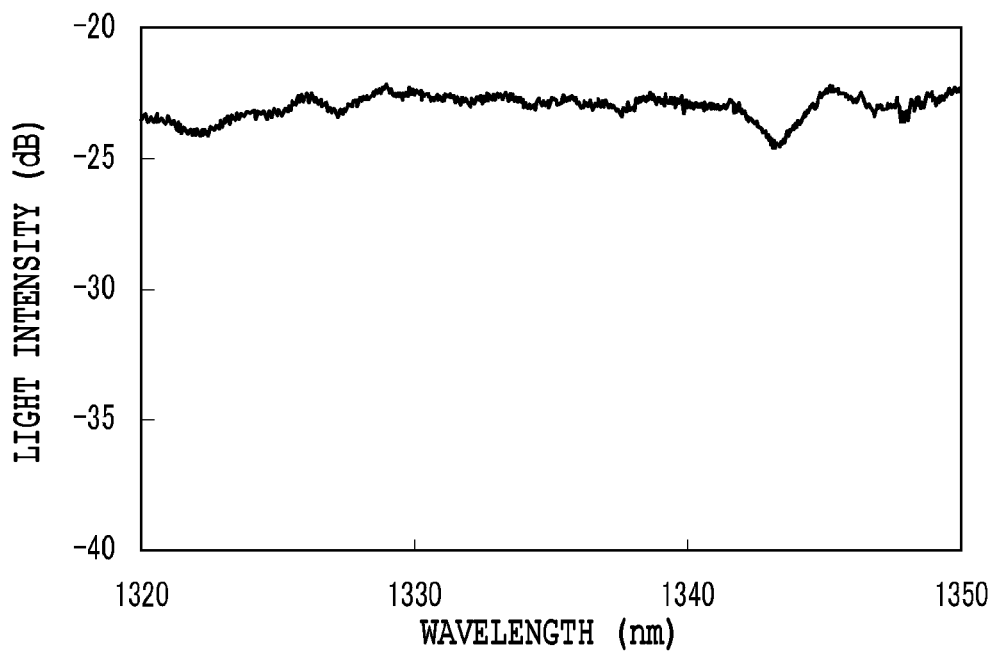
FIG. 25A is a chart showing an example of the respective wavelength sweep characteristics measured before the set-in of the etalon filter in the third embodiment.
Figure 25B:
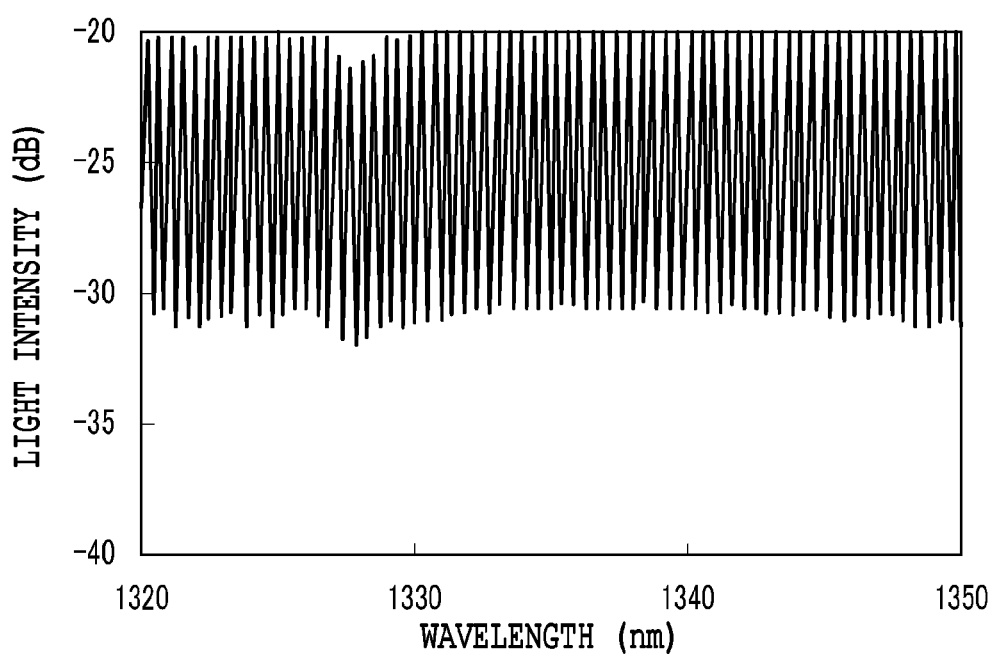
FIG. 25B is a chart showing an example of the respective wavelength sweep characteristics measured in the set-in of the etalon filter in the third embodiment.

FIG. 25A is a chart showing a wavelength sweep characteristic before the etalon filter 103 is set in, whereas FIG. 25B is a chart showing a wavelength sweep characteristic when the etalon filter 103 is set in. In the respective charts, the wavelength is represented as the horizontal axis, while the light intensity is represented as the vertical axis. It should be noted that in FIGS. 25A and 25B, a wavelength sweep characteristic is represented in relation to a wavelength of 1320 nm to 1350 nm. However, in observation, the wavelength sweep characteristic was confirmed for a wavelength width of 100 nm or greater.

As shown in FIG. 25A, the wavelength sweep characteristic before the set-in of the etalon filter 103 always had a light intensity of roughly −25 dB to −22 dB. This is because the line width of the oscillation spectrum was thick in a wavelength sweep and its respective peaks could not be observed. In the KTN optical scanner, the wavelength is continuously swept, while in the optical spectrum analyzer, the intake time of wavelength becomes much longer than the sweep time. Therefore, the light intensity shown in FIG. 25A corresponds to time average of superimposition of light spectrums swept by the KTN optical scanner, i.e., time average of integral spectrum.

It should be noted that in general, when an individual difference or variation in the KTN optical scanner, variation in the resonator 300 and/or so forth is/are occurred in a wavelength sweep, the respective line widths in oscillation are affected by such factor/factors. Therefore, chances are that coherence is further degraded than that before the wavelength sweep. In the wavelength sweep characteristic shown in FIG. 25A, a wavelength sweep was performed at a high speed, and therefore, the waveform in oscillation could not be observed. However, the coherence length was measured by a heretofore known Mach-Zehnder interference method, and thereby, it was confirmed that the coherence length during the wavelength sweep was degraded than that before the wavelength sweep.

On the other hand, as shown in FIG. 25B, in the wavelength sweep characteristic when the etalon filter 103 was set in, an oscillation spectrum with a constant line width was intermittently measured at constant wavelength intervals. In the example of FIG. 25B, the light intensity was roughly in a range of −33 dB to −20 dB or greater.

Figure 26:
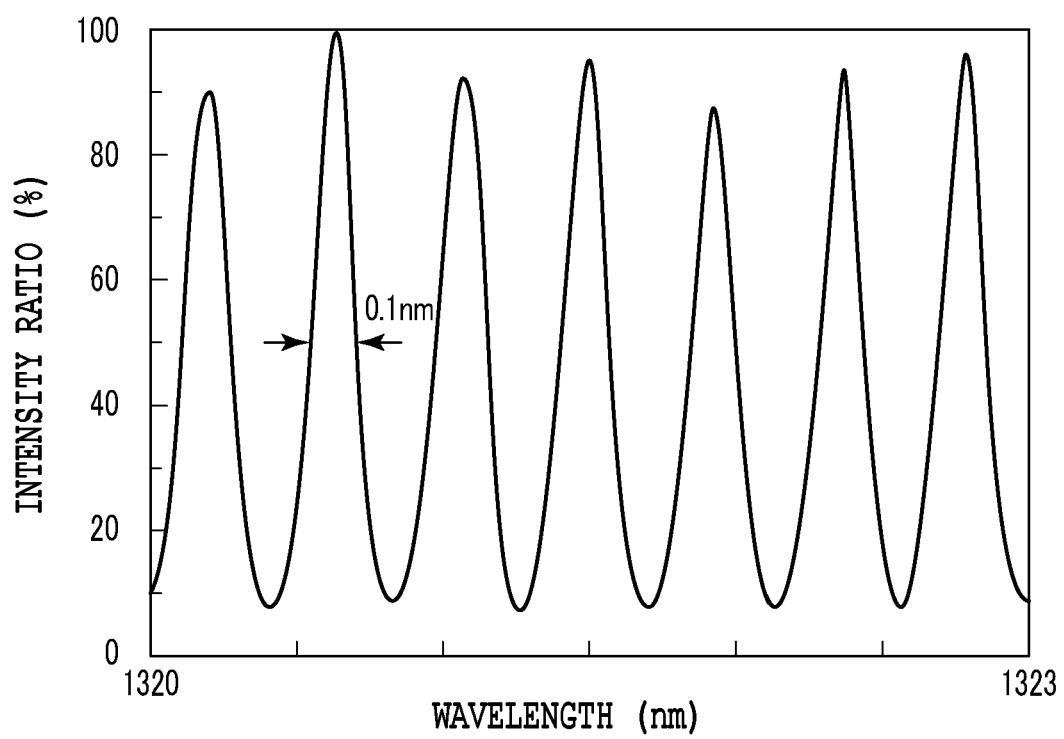
FIG. 26 is a chart showing an example, enlarged with regard to wavelength, of the wavelength sweep characteristic measured in the set-in of the etalon filter.

FIG. 26 is a chart showing an enlarged example of the wavelength sweep characteristic shown in FIG. 25B. In FIG. 26, the maximum light intensity in a wavelength range of 1320 nm to 1323 nm, shown in the wavelength sweep characteristic, is set to have an intensity ratio of 100%.

In this case, as shown in FIG. 26, the oscillation spectrum with an intensity ratio of 100% had a full width half maximum of 0.1 nm. Further, in the example of FIG. 26, all the line widths of the oscillation spectrum were always 0.1 nm or less. This was roughly the same as the result of the line widths of the oscillation spectrum before the wavelength sweep. In other words, it could be confirmed that, when the etalon filter 103 was set in, even if variation in the KTN optical scanner, variation in the resonator 300 and/or so forth were occurred in a wavelength sweep, impact of such variation/variations was relieved by the transmission characteristic of the etalon filter 103, and a good coherence length could be always maintained even during the wavelength sweep.

It was found that an oscillation characteristic with a good coherence length over the entire wavelength band could be obtained during a wavelength sweep by thus setting the etalon filter 103 in the wavelength swept light source 1b. Therefore, it can be considered that an oscillation characteristic always having a good coherence length can be obtained similarly in the respective wavelength swept light sources of the respective embodiments, when the respective wavelength swept light sources are designed to include the etalon filter 103 configured to produce a transmission spectrum with an always constant full width half maximum. In other words, the wavelength swept light sources of the respective embodiments intermittently output light having a desired frequency with a constant spectrum full width half maximum at constant frequency intervals.

This means that the coherence length of the output light of the wavelength swept light source, i.e., coherence is not degraded by environmental changes (e.g., aging, temperature change, etc.) of the respective optical components (the SOA, the diffraction grating, the deflector, the collective lens, etc.) to be caused during a wavelength sweep. In other words, this means that coherence before a wavelength sweep is not graded than that during the wavelength sweep. Therefore, for instance, when an object is measured using the wavelength swept light sources of the respective embodiments by means of optical coherent tomography (OCT), such inconvenience is not produced that limitation is imposed on the measurable depth.

Put the above together, the etalon filter 103 as the second resonator is supposed to control not only the oscillation frequency intervals but also the oscillation spectrum full width half maximum. Even if such an event of degrading light coherence during a wavelength sweep occurred, light coherence is guaranteed at the constant-interval oscillation wavelength (oscillation frequency) regulated by the second resonator, and high coherence can be maintained over the entire sweep band.

The respective embodiments and practical examples (hereinafter referred to as "respective embodiments and so forth") of the present invention have been described above in detail. However, the specific configurations are not limited to those in the respective embodiments and so forth, and design changes and so forth are therein encompassed without departing from the scope of the present invention.

In the wavelength swept light sources of the respective embodiments and so forth, the installation position of the etalon filter is not limited to the position shown in FIG. 19. For example, in the configuration shown in FIG. 19, the etalon filter may be disposed between the diffraction grating 104 and the mirror 105 or may be disposed between the LD 101 and the collective lens 111. Alternatively, in the configuration shown in FIG. 19, the etalon filter may be disposed between the electro-optic deflector 301 and the diffraction grating 104.

Further, various changes can be also made for such parameters as: the chip shape and the applied waveform of the KTN optical scanner; the respective characteristics (thickness, reflectivity, etc.) of the etalon filter; the grating pitch of the diffraction grating 104; and the operating frequency.

Further, FIG. 19 exemplifies the resonator configured with, for instance, a Littman arrangement. However, the resonator can be implemented by being configured with a Littrow arrangement that the diffraction grating has a mirror function as well.

In the configuration shown in FIG. 19, the electro-optic deflector 301 has been explained by exemplifying the KTN scanner having an electro-optic effect. However, an electro-optic deflector using another material may be applied. Alternatively, the configuration shown in FIG. 19 can be also implemented using a deflector such as a galvano mirror or a MESM mirror. Further, the configuration can be implemented with a plurality of etalon filters.

Explanation has been made above for the case that the etalon filter is used in the wavelength swept light source. However, the present invention is not limited to this. For example, a Michelson interferometer or the like may be used as long as output light can be intermittently obtained by changing the frequency intervals of the oscillation mode of the resonator.

In the third embodiment, explanation has been made for the case that the etalon filter 103 is disposed inside the resonator 300 in the wavelength swept light source 1b. However, a configuration may be employed that the etalon filter 103 is set outside the resonator 300 (e.g., in a position located on the output side of the optical isolator 112).

Working Example 8

The entire configuration of the wavelength swept light source in the present working example is the same as that shown in FIG. 19. In short, the wavelength swept light source 1b in the present working example includes, the resonator 300, the respective collective lenses 102 and 111, the etalon filter 103, the diffraction grating 104, the mirror 105, the optical isolator 112 and the electro-optic deflector 301. In the present working example, a SOA (Semiconductor Optical Amplifier), for instance, was used as the LD 101.

A condition is herein assumed that a resonant state is deviated from an optimal resonant state due to the positional misalignment of the components of the resonator and so forth.

Because of deviation from the optimal state, a filter characteristic attributed to the wavelength selection of the diffraction grating 104 is degraded, and the line width of the wavelength to be extracted therefrom becomes wide. When oscillated under the condition, the wavelength will have a wide line width, and therefore, only the low coherence light can be obtained (see FIG. 27A).

On the other hand, when the etalon filter 103 has been set-in in the aforementioned state, the filter characteristic of the entire resonator 300 corresponds to superimposition of the filter characteristic attributed to the wavelength selection of the diffraction grating 104 and the filter characteristic of the etalon filter 103, and has a shape that the expanded filter characteristic of the diffraction grating 104 is partially suppressed by the etalon filter. Accordingly, in comparison with the state without the etalon filter, a frequency is oscillated with a narrow line width, and high coherence light can be obtained (see FIG. 27B).

With regard to the following three points, a silicon etalon filter is more effective than a glass etalon filter.

An etalon filter made of silicon (with a reflective index of 3.5) with a thickness of 3 mm and a reflectivity of 31% on the both surfaces was used as the etalon filter 103 in the present working example (silicon etalon filter).

To obtain an etalon effect, the etalon filter is required to be set into the resonator at perpendicularity whereby an interference phenomenon due to multiple reflections can be produced. Silicon has a refractive index higher than that of glass. The refractive index of silicon is 3.5, whereas the refractive index of glass is 1.5. Therefore, in the case of silicon, an interference phenomenon due to multiple reflections tends to be produced even when the aforementioned perpendicularity is bad. In other words, it can be concluded that the silicon etalon filter has relatively high robustness with respect to misalignment and variation in perpendicularity when being set into the optical system. Therefore, the silicon etalon filter is more effective than the glass etalon filter regarding easiness of optical alignment.

Further, the optical path length within the etalon filter is required to be increased for reducing the frequency interval of the oscillation mode, i.e., for more densely activating the oscillation mode. Silicon has a refractive index that is 2.3 times as large as that of glass. Therefore, with a thickness less than or equal to roughly half the thickness of glass, silicon can implement an optical path length similar to that of glass. Therefore, the volume occupied by the etalon filter within the resonator can be reduced, and thus, silicon is effective for reducing the size of the resonator.

Further, silicon has a high refractive index, and therefore, its Fresnel loss is high and its reflectivity is high. As to silicon, a reflective film is not required to be vapor-deposited onto a substrate in order to achieve a high reflectivity as with glass. Further, an etalon with a required reflectivity can be obtained only by cutting a silicon substrate. Therefore, silicon is economically effective.

Figure 28:
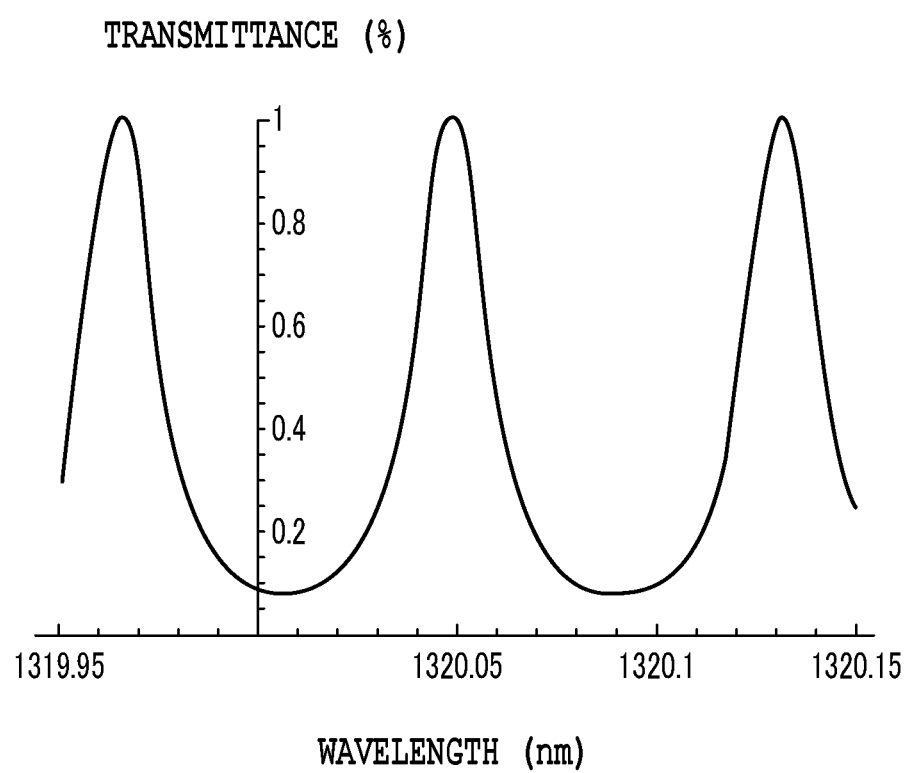
FIG. 28 is a chart showing an exemplary relation between the input wavelength and the transmittance of the etalon filter.

FIG. 28 is a chart showing an exemplary relation between the input wavelength and the transmittance of the etalon filter 103. It should be noted that the wavelength is represented as the horizontal axis while the transmittance is represented as the vertical axis.

As shown in FIG. 28, in the etalon filter 103, the transmittance is configured to periodically vary with respect to the wavelength. In this case, the full width half maximum of the transmission spectrum is configured to be always constant in each period.

In the diffraction grating 104 of the present working example, the grating pitch is set to be, for instance, 950 l/mm.

For example, a KTN optical scanner capable of performing a high speed deflection operation was used as the electro-optic deflector 301. The KTN optical scanner changes the incident angle into the diffraction grating 104 for making the oscillation wavelength variable. In the present working example, a flat sheet structure of 4(l)×3(w)×1.5(t) mm$^3$, for instance, was employed as the chip shape of the KTN optical scanner. Further, Ti/Pt/Au electrodes were formed on the respective faces (both of the front and back faces) with an area of 4(l)×3(w) mm$^2$ of the KTN crystal, and an electric field was configured to be applied in the thickness direction. Further, a region in which the KTN crystal forms a cubical crystal system was configured to have a permittivity of roughly 20000 by controlling the operating temperature of KTN using a Peltier temperature controller. Yet further, in the present working example, a sine wave voltage, set to have a frequency f of 200 kHz and a potential Vpp of 800 V, was applied to the KTN. Accordingly, the wavelength swept light source 1b of the present working example was enabled to perform a wavelength sweep at a high frequency of 200 kHz in a broad band.

Next, the wavelength swept light source 1b of the present working example was operated and a wavelength sweep characteristic was observed through the measurement by a light spectrum analyzer. Explanation will be hereinafter made for the observational result.

Figure 29B:
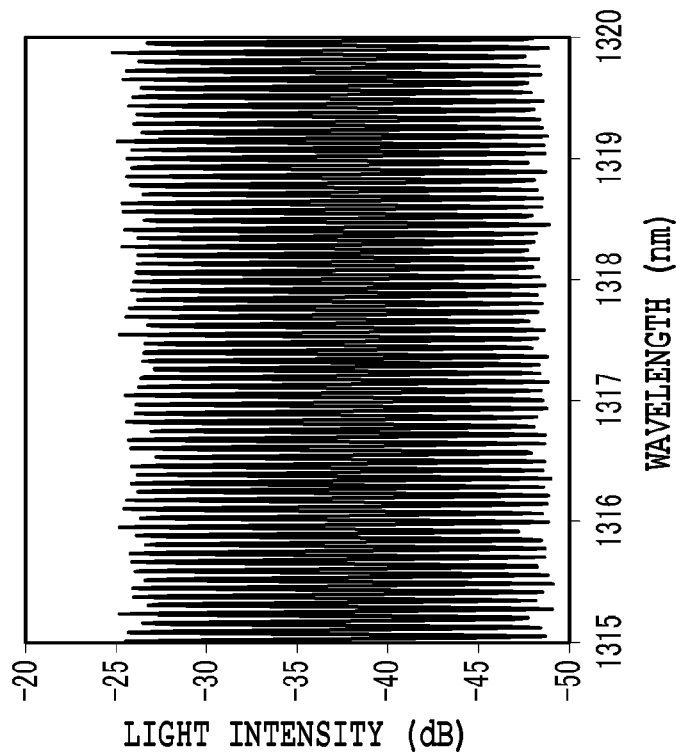
FIG. 29B is a chart showing a wavelength sweep characteristic in the set-in of the etalon filter.
Figure 29A:
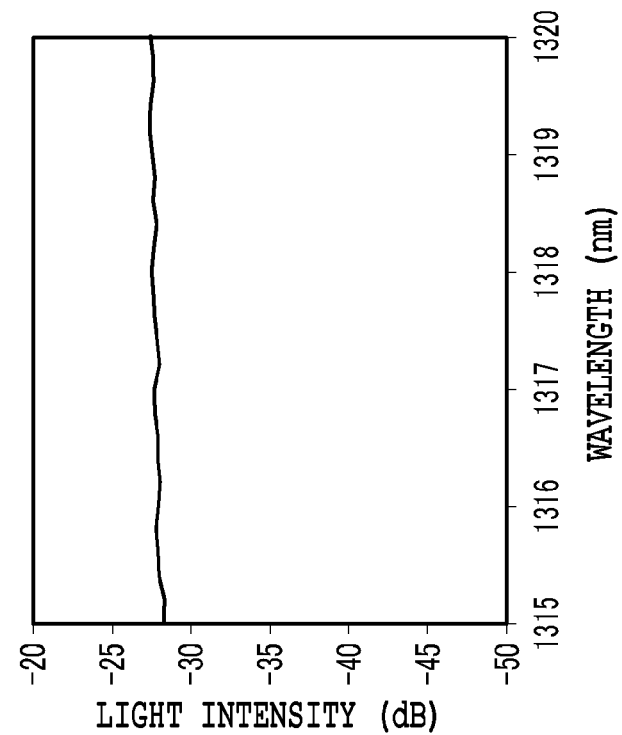
FIG. 29A is a chart showing an example of the respective wavelength sweep characteristics of the wavelength swept light source before the set-in of the etalon filter.

FIG. 29A is a chart showing an example of each wavelength sweep characteristic of the wavelength swept light source 1b before the etalon filter 103 is set in, whereas FIG. 29B is a chart showing a wavelength sweep characteristic when the etalon filter 103 is set in. In the respective charts, the wavelength is represented as the horizontal axis, while the light intensity is represented as the vertical axis. It should be noted that in FIGS. 29A and 29B, a wavelength sweep characteristic is represented in relation to a wavelength of 1315 nm to 1320 nm.

As shown in FIG. 29A, the wavelength sweep characteristic before the set-in of the etalon filter 103 always had a light intensity of roughly −30 dB to −25 dB. This is because the line width of the oscillation spectrum was thick in a wavelength sweep and its respective peaks could not be observed. In the KTN optical scanner, the wavelength is continuously swept, while in the optical spectrum analyzer, the intake time of wavelength becomes much longer than the sweep time. Therefore, the light intensity shown in FIG. 29A corresponds to time average of superimposition of light spectrums swept by the KTN optical scanner, i.e., time average of integral spectrum.

It should be noted that in general, when an individual difference or variation in the KTN optical scanner, variation in the resonator 300 and/or so forth is/are occurred in a wavelength sweep, the respective line widths in oscillation are affected by such factor/factors. Therefore, chances are that coherence is further degraded than that before the wavelength sweep. In the wavelength sweep characteristic shown in FIG. 29A, a wavelength sweep was performed at a high speed, and therefore, the waveform in oscillation could not be observed. However, the coherence length was measured by a heretofore known Mach-Zehnder interference method, and thereby, it was confirmed that the coherence length during the wavelength sweep was degraded than that before the wavelength sweep.

On the other hand, as shown in FIG. 29B, in the wavelength sweep characteristic when the etalon filter 103 was set in, an oscillation spectrum with a constant line width was intermittently measured at constant wavelength intervals.

Figure 30:
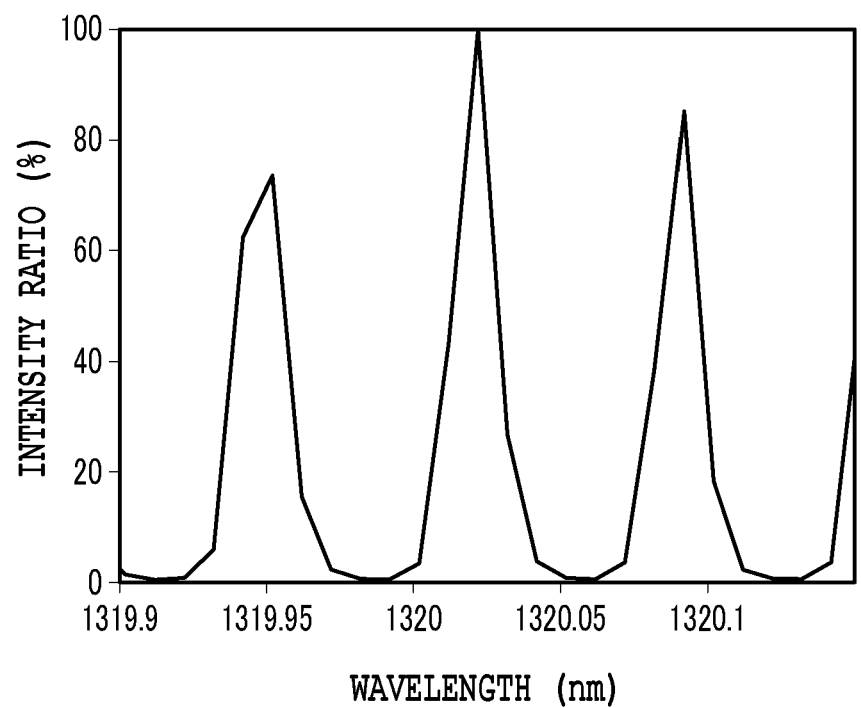
FIG. 30 is a chart showing an enlarged example of the wavelength sweep characteristic shown in FIG. 29B in a range of 1319.9 nm to 1320.15 nm.

FIG. 30 is a chart showing an enlarged example of the wavelength sweep characteristic shown in FIG. 29B in a range of 1319.9 nm to 1320.15 nm. In FIG. 30, the maximum light intensity in a wavelength range of 1319.9 nm to 1320.15 nm shown in the wavelength sweep characteristic of FIG. 29B is set to have an intensity ratio of 100%. It should be noted that fluctuation of the intensity ratio of a spectrum is attributed to the fact that the measurement is performed with roughly a resolution limit.

In this case, as shown in FIG. 28, the oscillation spectrum with an intensity ratio of 100% had a full width half maximum of roughly 0.025 nm. Further, in the example of FIG. 28, all the line widths of the oscillation spectrum were always 0.025 nm or less. This was roughly the same as the result of the line widths of the oscillation spectrum before the wavelength sweep. In other words, it could be confirmed that, when the etalon filter 103 was set in, even if variation in the KTN optical scanner, variation in the resonator 300 and/or so forth were occurred in a wavelength sweep, impact of such variation/variations was relieved by the transmission characteristic of the etalon filter 103, and a good coherence length could be always maintained even during the wavelength sweep.

It was found that an oscillation characteristic with a good coherence length over the entire wavelength band could be obtained during a wavelength sweep by thus setting the etalon filter 103 in the wavelength swept light source 1b. Therefore, it can be considered that an oscillation characteristic always having a good coherence length can be obtained similarly in the respective wavelength swept light sources of the respective embodiments, when the respective wavelength swept light sources are designed to include the etalon filter 103 configured to produce a transmission spectrum with an always constant full width half maximum. In other words, the wavelength swept light sources of the respective embodiments intermittently output light having a desired frequency with a constant spectrum full width half maximum at constant frequency intervals.

This means that the coherence length of the output light of the wavelength swept light source, i.e., coherence is not degraded by environmental changes (e.g., aging, temperature change, etc.) of the respective optical components (the SOA, the diffraction grating, the deflector, the collective lens, etc.) to be caused during a wavelength sweep. Therefore, this is advantageous, for instance, when an object is measured using the wavelength swept light sources of the respective embodiments by means of optical coherent tomography (OCT).

It should be noted that, when an OCT measurement is conducted using a wavelength swept light source in which an etalon filter is set, the coherence length available for the measurement is limited to the length related to the optical path length of the set-in etalon filter.

The relation of the following Math. 23 is established where the coherence length required for the OCT measurement is set as lc; the thickness of an etalon filter is set as d; and the refractive index is set as n.

$$d > \frac{lc}{n}$$ Math. 23

INDUSTRIAL APPLICABILITY

The present invention can be used for an optical signal processing device. Especially, the present invention can be utilized for optical coherence tomography.

REFERENCE SIGNS LIST

1 Light source
2, 22 Beam Splitter
3, 23, 110 Mirror
4, 24 Living organism
5, 25 Photo detector
21, 100, 200, 300 Wavelength swept light source
31, 32, 33 Reflection surface
101 Gain medium
102, 111 Collective lens
103 Electro-optic deflector
104 Controlled voltage
106, 19 Diffraction grating
112 Output coupling mirror
115 Sawtooth waveform generator
116, 118 Multiplier
117, 119 Accumulator
120 Polygon mirror
201, 301 Oscillator part
202, 302 Controlled voltage generator part
300 Resonator
101 LD
102 Second collective lens
103 etalon filter
104 Diffraction grating
105 Mirror
111 First collective lens
112 Optical isolator
301 Electro-optic deflector
302 Controlled voltage source
S1 Output light

The invention claimed is:
1. A wavelength swept light source in which an output wavelength temporally and periodically varies, comprising:
   an oscillator part comprising:
      a resonator having a gain medium and a diffraction grating both positioned in an optical path formed by the resonator; and
      an electro-optic deflector disposed in the optical path between the gain medium and the diffraction grating, the electro-optic deflector being comprised of an electro-optic crystal having potassium tantalate niobate or potassium tantalate niobate doped with lithium; and a controlled voltage generator part configured to generate a control signal to provide to the electro-optic deflector, the control signal being a controlled voltage comprised of a sawtooth waveform having superimposed thereon an exponential component of the sawtooth waveform according to an equation:

$$v(t)=g(t)+\alpha g^2(t)$$

where
v(t) is the controlled voltage,
g(t) is the sawtooth waveform, and
$\alpha g^2(t)$ is the exponential component of the sawtooth waveform having a coefficient $\alpha$;
wherein the electro-optic deflector is configured such that when the control signal is applied to the electro-optic deflector, an electric field is generated that causes charges to be injected into the electro-optic crystal so that a gradient of a refractive index of the electro-optic deflector is evoked due to a non-uniform electric field distribution attributed to the charge distribution of the electro-optic crystal, the gradient of the refractive index of the electro-optic deflector causing a light ray path through the electro-optic deflector to be bent perpendicular to the gradient.

2. The wavelength swept light source recited in claim 1, wherein light enters the diffraction grating from an end of the gain medium and the exponential component is a squared component in which the coefficient $\alpha$ is expressed with an equation $$\gamma \frac{3+\cos 2\theta}{2\sin 2\theta}$$

such that the squared component is superimposed on the sawtooth waveform, where a light incident angle into the diffraction grating from the electro-optic deflector is set as $\theta$; and a controlled-voltage-to-angle sensitivity of the electro-optic deflector is set as $\gamma$ [rad/V].

3. The wavelength swept light source recited in claim 2, wherein the controlled voltage v(t) also comprises a further exponential component of the sawtooth waveform according to an equation $$v(t)=g(t)+\alpha g^2(t)+\beta g^3(t)$$

where
$\beta g^3(t)$ is the further exponential component of the sawtooth waveform having a coefficient $\beta$; and
wherein the further exponential component is a cubed component in which the coefficient $\beta$ is expressed with an equation $$\gamma^2 \frac{17+6\cos 2\theta+\cos 4\theta}{6\sin^2 2\theta}$$

such that the cubed component is also superimposed on the sawtooth waveform in addition to the squared component.

4. The wavelength swept light source recited in claim 1, wherein incident light enters the diffraction grating from an end of the gain medium, and the oscillator part further comprises an end surface mirror in which a diffracted light of the incident light into the diffraction grating enters at a normal incidence, and
the exponential component is a squared component in which the coefficient $\alpha$ is expressed with an equation $$\gamma \frac{3+\cos 2\theta+2\sin\phi\sin\theta}{2(\sin 2\theta+2\sin\phi\cos\theta)}$$

such that the squared component is superimposed on the sawtooth waveform, where a light incident angle into the diffraction grating from the electro-optic deflector is set as $\theta$; a light incident angle into the diffraction grating from the end surface mirror is set as $\phi$; and a controlled-voltage-to-angle sensitivity of the electro-optic deflector is set as $\gamma$ [rad/V].

5. The wavelength swept light source recited in claim 4, wherein the controlled voltage v(t) also comprises a further exponential component of the sawtooth waveform according to an equation $$v(t)=g(t)+\alpha g^2(t)+\beta g^3(t)$$

where
$\beta g^3(t)$ is the further exponential component of the sawtooth waveform having a coefficient $\beta$; and
wherein the further exponential component is a cubed component in which the coefficient $\beta$ is expressed with an equation $$\gamma^2 \frac{21-4\cos\theta+26\sin\phi\sin\theta+2(2+\cos 2\phi)\cos 2\theta+2\sin\phi\sin 3\theta+\cos 4\theta}{6(\sin 2\theta+2\sin\phi\cos\theta)^2}$$

such that the cubed component is also superimposed on the sawtooth waveform in addition to the squared component.

6. The wavelength swept light source recited in claim 1,
wherein the resonator is a first resonator configured to oscillate a light at frequency intervals of a first oscillation mode,
the first resonator includes a second resonator in an inside thereof, the second resonator configured to oscillate a light at frequency intervals of a second oscillation mode corresponding to a second resonator length shorter than a first resonator length of the first resonator, and
the first resonator is configured to output a light oscillated at a frequency that matches a frequency of the second oscillation mode.

7. The wavelength swept light source recited in claim 1,
wherein the resonator is a first resonator configured to oscillate a light at a frequency of a first oscillation mode,
the first resonator includes a second resonator on an outside thereof, the second resonator configured to oscillate a light at frequency intervals of a second oscillation mode corresponding to a second resonator length shorter than a first resonator length of the first resonator, and
the second resonator is configured to output a light oscillated at a frequency that matches a frequency of the first oscillation mode.

8. The wavelength swept light source recited in claim 1,
wherein the resonator is a first resonator configured to oscillate a light at a frequency of a first oscillation mode,
the first resonator includes a plurality of second resonators in an inside thereof and/or on an outside thereof, the second resonators respectively configured to oscillate a light at frequency intervals of a single or plurality of second oscillation modes corresponding to a single or plurality of second resonator lengths shorter than a first resonator length of the first resonator, and the second resonators are respectively configured to output a light oscillated at a frequency matching a frequency of the first oscillation mode and each second oscillation mode.

9. The wavelength swept light source recited in claim 6, wherein the second resonator is configured such that a transmittance can periodically vary with respect to a wavelength and a full width half maximum of a transmission spectrum can be constant in each period.

10. The wavelength swept light source recited in claim 7, wherein the second resonator is configured such that a transmittance can periodically vary with respect to a wavelength and a full width half maximum of a transmission spectrum can be constant in each period.

11. The wavelength swept light source recited in claim 8, wherein the second resonators are configured such that a transmittance can periodically vary with respect to a wavelength and a full width half maximum of a transmission spectrum can be constant in each period.

12. A wavelength swept light source in which an output wavelength temporally and periodically varies, comprising:
an oscillator part comprising:
a resonator having a gain medium and a diffraction grating both positioned in an optical path formed by the resonator; and
an electro-optic deflector disposed in the optical path between the gain medium and the diffraction grating, the electro-optic deflector being comprised of an electro-optic crystal having potassium tantalate niobate or potassium tantalate niobate doped with lithium; and
a controlled voltage generator part configured to generate a control signal to provide to the electro-optic deflector, the control signal being a controlled voltage comprised of a sawtooth waveform having superimposed thereon one or more exponential components of the sawtooth waveform according to an equation:

$v(t)=g(t)+\alpha g^2(t)+\beta g^3(t)+\ldots$ where
v(t) is the controlled voltage,
g(t) is the sawtooth waveform; and
$\alpha g^2(t)+\beta g^3(t)+\ldots$ are the exponential components of the sawtooth waveform;

wherein the electro-optic deflector is configured such that when the control signal is applied to the electro-optic deflector; an electric field is generated that causes charges to be injected into the electro-optic crystal so that a gradient of a refractive index of the electro-optic deflector is evoked due to a non-uniform electric field distribution attributed to the charge distribution of the electro-optic crystal, the gradient of the refractive index of the electro-optic deflector causing a light ray path through the electro-optic deflector to be bent perpendicular to the gradient.

13. The wavelength swept light source recited in claim 12, wherein light enters the diffraction grating from an end of the gain medium, and wherein $$\alpha = \gamma \frac{3+\cos2\theta}{2\sin2\theta}$$

where
θ is a light incident angle into the diffraction grating from the electro-optic deflector, and
γ is a controlled-voltage-to-angle sensitivity of the electro-optic deflector [rad/V].

14. The wavelength swept light source recited in claim 13; wherein $$\beta = \gamma^2 \frac{17+6\cos2\theta+\cos4\theta}{6\sin^2 2\theta}.$$

15. The wavelength swept light source recited in claim 12, wherein incident light enters the diffraction grating from an end of the gain medium, and the oscillator part further comprises an end surface mirror in which a diffracted light of the incident light into the diffraction grating enters at a normal incidence, and wherein $$\alpha = \gamma \frac{3+\cos2\theta+2\sin\phi\sin\theta}{2(\sin2\theta+2\sin\phi\cos\theta)}$$

where
θ is a light incident angle into the diffraction grating from e electro-optic deflector,
φ is a light incident angle into the diffraction grating from the end surface minor, and
γ is a controlled-voltage-to-angle sensitivity of the electro-optic deflector [rad/V].

16. The wavelength swept light source recited in claim 15, wherein $$\beta = \gamma^2 \frac{21-4\cos\theta+26\sin\phi\sin\theta+2(2+\cos2\phi)\cos2\theta+2\sin\phi\sin3\theta+\cos4\theta}{6(\sin2\theta+2\sin\phi\cos\theta)^2}.$$

\* \* \* \* \*